United States Patent
Simon et al.

(10) Patent No.: US 8,541,958 B2
(45) Date of Patent: Sep. 24, 2013

(54) LED LIGHT WITH THERMOELECTRIC GENERATOR

(75) Inventors: David L. Simon, Grosse Pointe Woods, MI (US); John Ivey, Farmington Hills, MI (US); James R. Scapa, West Bloomfield, MI (US)

(73) Assignee: iLumisys, Inc., Troy, MI (US)

( * ) Notice: Subject to any disclaimer, the term of this patent is extended or adjusted under 35 U.S.C. 154(b) by 236 days.

(21) Appl. No.: 13/071,698

(22) Filed: Mar. 25, 2011

(65) Prior Publication Data

US 2011/0234107 A1    Sep. 29, 2011

Related U.S. Application Data

(60) Provisional application No. 61/317,841, filed on Mar. 26, 2010.

(51) Int. Cl.
*H05B 37/02*   (2006.01)

(52) U.S. Cl.
USPC ............................ 315/307; 315/157; 315/291

(58) Field of Classification Search
USPC .................. 315/157, 291, 307–309, 276, 312
See application file for complete search history.

(56) References Cited

U.S. PATENT DOCUMENTS

| | | |
|---|---|---|
| 54,511 A | 2/1920 | Owen |
| 58,105 A | 6/1921 | Poritz |
| 79,814 A | 8/1929 | Hoch |
| 80,419 A | 1/1930 | Kramer |
| 84,763 A | 7/1931 | Stange |
| D119,797 S | 4/1940 | Winkler et al. |
| D125,312 S | 2/1941 | Logan |
| 2,909,097 A | 10/1959 | Alden et al. |
| 3,318,185 A | 5/1967 | Kott |
| 3,561,719 A | 2/1971 | Grindle |
| 3,586,936 A | 6/1971 | McLeroy |
| 3,601,621 A | 8/1971 | Ritchie |
| 3,612,855 A | 10/1971 | Juhnke |
| 3,643,088 A | 2/1972 | Osteen et al. |
| 3,746,918 A | 7/1973 | Drucker et al. |

(Continued)

FOREIGN PATENT DOCUMENTS

| | | |
|---|---|---|
| CN | 1584388 A | 2/2005 |
| CN | 2766345 Y | 3/2006 |

(Continued)

OTHER PUBLICATIONS

Notification of Transmittal, International Search Report and Written Opinion of the International Searching Authority from the corresponding International Application No. PCT/US2011/029932 dated Nov. 21, 2011.

(Continued)

*Primary Examiner* — Don Le
(74) *Attorney, Agent, or Firm* — Young Basile

(57) ABSTRACT

An LED based light and a method of providing power to the LED are disclosed. The LED based light includes at least one LED and at least one thermoelectric generator having a first side and a second side. The first side is thermally coupled to the at least one LED such that heat generated by the at least one LED is conducted to the at least one thermoelectric generator, producing a temperature differential between the first side and second side. The at least one thermoelectric generator is configured to produce electrical energy from the temperature differential.

19 Claims, 3 Drawing Sheets

(56) References Cited

U.S. PATENT DOCUMENTS

| | | |
|---|---|---|
| 3,818,216 A | 6/1974 | Larraburu |
| 3,832,503 A | 8/1974 | Crane |
| 3,858,086 A | 12/1974 | Anderson et al. |
| 3,909,670 A | 9/1975 | Wakamatsu et al. |
| 3,924,120 A | 12/1975 | Cox, III |
| 3,958,885 A | 5/1976 | Stockinger et al. |
| 3,974,637 A | 8/1976 | Bergey et al. |
| 3,993,386 A | 11/1976 | Rowe |
| 4,001,571 A | 1/1977 | Martin |
| 4,054,814 A | 10/1977 | Fegley et al. |
| 4,070,568 A | 1/1978 | Gala |
| 4,082,395 A | 4/1978 | Donato et al. |
| 4,096,349 A | 6/1978 | Donato |
| 4,102,558 A | 7/1978 | Krachman |
| 4,107,581 A | 8/1978 | Abernethy |
| 4,189,663 A | 2/1980 | Schmutzer et al. |
| 4,211,955 A | 7/1980 | Ray |
| 4,241,295 A | 12/1980 | Williams, Jr. |
| 4,271,408 A | 6/1981 | Teshima et al. |
| 4,272,689 A | 6/1981 | Crosby et al. |
| 4,273,999 A | 6/1981 | Pierpoint |
| 4,298,869 A | 11/1981 | Okuno |
| 4,329,625 A | 5/1982 | Nishizawa et al. |
| 4,339,788 A | 7/1982 | White et al. |
| 4,342,947 A | 8/1982 | Bloyd |
| 4,367,464 A | 1/1983 | Kurahashi et al. |
| D268,134 S | 3/1983 | Zurcher |
| 4,382,272 A | 5/1983 | Quella et al. |
| 4,388,567 A | 6/1983 | Yamazaki et al. |
| 4,388,589 A | 6/1983 | Molldrem, Jr. |
| 4,392,187 A | 7/1983 | Bornhorst |
| 4,394,719 A | 7/1983 | Moberg |
| 4,420,711 A | 12/1983 | Takahashi et al. |
| 4,455,562 A | 6/1984 | Dolan et al. |
| 4,500,796 A | 2/1985 | Quin |
| 4,521,835 A | 6/1985 | Meggs et al. |
| 4,581,687 A | 4/1986 | Nakanishi |
| 4,597,033 A | 6/1986 | Meggs et al. |
| 4,600,972 A | 7/1986 | MacIntyre |
| 4,607,317 A | 8/1986 | Lin |
| 4,622,881 A | 11/1986 | Rand |
| 4,625,152 A | 11/1986 | Nakai |
| 4,635,052 A | 1/1987 | Aoike et al. |
| 4,647,217 A | 3/1987 | Havel |
| 4,656,398 A | 4/1987 | Michael et al. |
| 4,661,890 A | 4/1987 | Watanabe et al. |
| 4,668,895 A | 5/1987 | Schneiter |
| 4,675,575 A | 6/1987 | Smith et al. |
| 4,682,079 A | 7/1987 | Sanders et al. |
| 4,686,425 A | 8/1987 | Havel |
| 4,687,340 A | 8/1987 | Havel |
| 4,688,154 A | 8/1987 | Nilssen |
| 4,688,869 A | 8/1987 | Kelly |
| 4,695,769 A | 9/1987 | Schweickardt |
| 4,698,730 A | 10/1987 | Sakai et al. |
| 4,701,669 A | 10/1987 | Head et al. |
| 4,705,406 A | 11/1987 | Havel |
| 4,707,141 A | 11/1987 | Havel |
| D293,723 S | 1/1988 | Buttner |
| 4,727,289 A | 2/1988 | Uchida |
| 4,740,882 A | 4/1988 | Miller |
| 4,748,545 A | 5/1988 | Schmitt |
| 4,753,148 A | 6/1988 | Johnson |
| 4,758,173 A | 7/1988 | Northrop |
| 4,771,274 A | 9/1988 | Havel |
| 4,780,621 A | 10/1988 | Bartleucci et al. |
| 4,794,383 A | 12/1988 | Havel |
| 4,810,937 A | 3/1989 | Havel |
| 4,818,072 A | 4/1989 | Mohebban |
| 4,824,269 A | 4/1989 | Havel |
| 4,837,565 A | 6/1989 | White |
| 4,843,627 A | 6/1989 | Stebbins |
| 4,845,481 A | 7/1989 | Havel |
| 4,845,745 A | 7/1989 | Havel |
| 4,857,801 A | 8/1989 | Farrell |
| 4,863,223 A | 9/1989 | Weissenbach et al. |
| 4,870,325 A | 9/1989 | Kazar |
| 4,874,320 A | 10/1989 | Freed et al. |
| 4,887,074 A | 12/1989 | Simon et al. |
| 4,894,832 A | 1/1990 | Colak |
| 4,901,207 A | 2/1990 | Sato et al. |
| 4,912,371 A | 3/1990 | Hamilton |
| 4,922,154 A | 5/1990 | Cacoub |
| 4,929,936 A | 5/1990 | Friedman et al. |
| 4,934,852 A | 6/1990 | Havel |
| 4,941,072 A | 7/1990 | Yasumoto et al. |
| 4,943,900 A | 7/1990 | Gartner |
| 4,962,687 A | 10/1990 | Belliveau et al. |
| 4,965,561 A | 10/1990 | Havel |
| 4,973,835 A | 11/1990 | Kurosu et al. |
| 4,977,351 A | 12/1990 | Bavaro et al. |
| 4,979,081 A | 12/1990 | Leach et al. |
| 4,979,180 A | 12/1990 | Muncheryan |
| 4,980,806 A | 12/1990 | Taylor et al. |
| 4,992,704 A | 2/1991 | Stinson |
| 5,003,227 A | 3/1991 | Nilssen |
| 5,008,595 A | 4/1991 | Kazar |
| 5,008,788 A | 4/1991 | Palinkas |
| 5,010,459 A | 4/1991 | Taylor et al. |
| 5,018,054 A | 5/1991 | Ohashi et al. |
| 5,027,037 A | 6/1991 | Wei |
| 5,027,262 A | 6/1991 | Freed |
| 5,032,960 A | 7/1991 | Katoh |
| 5,034,807 A | 7/1991 | Von Kohorn |
| 5,036,248 A | 7/1991 | McEwan et al. |
| 5,038,255 A | 8/1991 | Nishihashi et al. |
| 5,065,226 A | 11/1991 | Kluitmans et al. |
| 5,072,216 A | 12/1991 | Grange |
| 5,078,039 A | 1/1992 | Tulk et al. |
| 5,083,063 A | 1/1992 | Brooks |
| 5,088,013 A | 2/1992 | Revis |
| 5,089,748 A | 2/1992 | Ihms |
| 5,103,382 A | 4/1992 | Kondo et al. |
| 5,122,733 A | 6/1992 | Havel |
| 5,126,634 A | 6/1992 | Johnson |
| 5,128,595 A | 7/1992 | Hara |
| 5,130,909 A | 7/1992 | Gross |
| 5,134,387 A | 7/1992 | Smith et al. |
| 5,140,220 A | 8/1992 | Hasegawa |
| 5,142,199 A | 8/1992 | Elwell |
| 5,151,679 A | 9/1992 | Dimmick |
| 5,154,641 A | 10/1992 | McLaughlin |
| 5,161,879 A | 11/1992 | McDermott |
| 5,161,882 A | 11/1992 | Garrett |
| 5,164,715 A | 11/1992 | Kashiwabara et al. |
| 5,184,114 A | 2/1993 | Brown |
| 5,194,854 A | 3/1993 | Havel |
| 5,198,756 A | 3/1993 | Jenkins et al. |
| 5,209,560 A | 5/1993 | Taylor et al. |
| 5,220,250 A | 6/1993 | Szuba |
| 5,225,765 A | 7/1993 | Callahan et al. |
| 5,226,723 A | 7/1993 | Chen |
| 5,254,910 A | 10/1993 | Yang |
| 5,256,948 A | 10/1993 | Boldin et al. |
| 5,278,542 A | 1/1994 | Smith et al. |
| 5,282,121 A | 1/1994 | Bornhorst et al. |
| 5,283,517 A | 2/1994 | Havel |
| 5,287,352 A | 2/1994 | Jackson et al. |
| 5,294,865 A | 3/1994 | Haraden |
| 5,298,871 A | 3/1994 | Shimohara |
| 5,301,090 A | 4/1994 | Hed |
| 5,303,124 A | 4/1994 | Wrobel |
| 5,307,295 A | 4/1994 | Taylor et al. |
| 5,321,593 A | 6/1994 | Moates |
| 5,323,226 A | 6/1994 | Schreder |
| 5,329,431 A | 7/1994 | Taylor et al. |
| 5,344,068 A | 9/1994 | Haessig |
| 5,350,977 A | 9/1994 | Hamamoto et al. |
| 5,357,170 A | 10/1994 | Luchaco et al. |
| 5,371,618 A | 12/1994 | Tai et al. |
| 5,374,876 A | 12/1994 | Horibata et al. |
| 5,375,043 A | 12/1994 | Tokunaga |
| D354,360 S | 1/1995 | Murata |
| 5,381,074 A | 1/1995 | Rudzewicz et al. |

| Patent No. | Date | Name |
|---|---|---|
| 5,388,357 A | 2/1995 | Malita |
| 5,402,702 A | 4/1995 | Hata |
| 5,404,282 A | 4/1995 | Klinke et al. |
| 5,406,176 A | 4/1995 | Sugden |
| 5,410,328 A | 4/1995 | Yoksza et al. |
| 5,412,284 A | 5/1995 | Moore et al. |
| 5,412,552 A | 5/1995 | Fernandes |
| 5,420,482 A | 5/1995 | Phares |
| 5,421,059 A | 6/1995 | Leffers, Jr. |
| 5,430,356 A | 7/1995 | Ference et al. |
| 5,432,408 A | 7/1995 | Matsuda et al. |
| 5,436,535 A | 7/1995 | Yang |
| 5,436,853 A | 7/1995 | Shimohara |
| 5,450,301 A | 9/1995 | Waltz et al. |
| 5,461,188 A | 10/1995 | Drago et al. |
| 5,463,280 A | 10/1995 | Johnson |
| 5,463,502 A | 10/1995 | Savage, Jr. |
| 5,465,144 A | 11/1995 | Parker et al. |
| 5,475,300 A | 12/1995 | Havel |
| 5,489,827 A | 2/1996 | Xia |
| 5,491,402 A | 2/1996 | Small |
| 5,493,183 A | 2/1996 | Kimball |
| 5,504,395 A | 4/1996 | Johnson et al. |
| 5,506,760 A | 4/1996 | Giebler et al. |
| 5,513,082 A | 4/1996 | Asano |
| 5,519,496 A | 5/1996 | Borgert et al. |
| 5,530,322 A | 6/1996 | Ference et al. |
| 5,544,809 A | 8/1996 | Keating et al. |
| 5,545,950 A | 8/1996 | Cho |
| 5,550,440 A | 8/1996 | Allison et al. |
| 5,559,681 A | 9/1996 | Duarte |
| 5,561,346 A | 10/1996 | Byrne |
| D376,030 S | 11/1996 | Cohen |
| 5,575,459 A | 11/1996 | Anderson |
| 5,575,554 A | 11/1996 | Guritz |
| 5,581,158 A | 12/1996 | Quazi |
| 5,592,051 A | 1/1997 | Korkala |
| 5,592,054 A | 1/1997 | Nerone et al. |
| 5,600,199 A | 2/1997 | Martin, Sr. et al. |
| 5,607,227 A | 3/1997 | Yasumoto et al. |
| 5,608,290 A | 3/1997 | Hutchisson et al. |
| 5,614,788 A | 3/1997 | Mullins et al. |
| 5,621,282 A | 4/1997 | Haskell |
| 5,621,603 A | 4/1997 | Adamec et al. |
| 5,621,662 A | 4/1997 | Humphries et al. |
| 5,622,423 A | 4/1997 | Lee |
| 5,633,629 A | 5/1997 | Hochstein |
| 5,634,711 A | 6/1997 | Kennedy et al. |
| 5,640,061 A | 6/1997 | Bornhorst et al. |
| 5,640,141 A | 6/1997 | Myllymaki |
| 5,642,129 A | 6/1997 | Zavracky et al. |
| 5,655,830 A | 8/1997 | Ruskouski |
| 5,656,935 A | 8/1997 | Havel |
| 5,661,374 A | 8/1997 | Cassidy et al. |
| 5,661,645 A | 8/1997 | Hochstein |
| 5,673,059 A | 9/1997 | Zavracky et al. |
| 5,682,103 A | 10/1997 | Burrell |
| 5,688,042 A | 11/1997 | Madadi et al. |
| 5,697,695 A | 12/1997 | Lin et al. |
| 5,701,058 A | 12/1997 | Roth |
| 5,712,650 A | 1/1998 | Barlow |
| 5,721,471 A | 2/1998 | Begemann et al. |
| 5,725,148 A | 3/1998 | Hartman |
| 5,726,535 A | 3/1998 | Yan |
| 5,731,759 A | 3/1998 | Finucan |
| 5,734,590 A | 3/1998 | Tebbe |
| 5,751,118 A | 5/1998 | Mortimer |
| 5,752,766 A | 5/1998 | Bailey et al. |
| 5,765,940 A | 6/1998 | Levy et al. |
| 5,769,527 A | 6/1998 | Taylor et al. |
| 5,784,006 A | 7/1998 | Hochstein |
| 5,785,227 A | 7/1998 | Akiba |
| 5,790,329 A | 8/1998 | Klaus et al. |
| 5,803,579 A | 9/1998 | Turnbull et al. |
| 5,803,580 A | 9/1998 | Tseng |
| 5,803,729 A | 9/1998 | Tsimerman |
| 5,806,965 A | 9/1998 | Deese |
| 5,808,689 A | 9/1998 | Small |
| 5,810,463 A | 9/1998 | Kawahara et al. |
| 5,812,105 A | 9/1998 | Van de Ven |
| 5,813,751 A | 9/1998 | Shaffer |
| 5,813,753 A | 9/1998 | Vriens et al. |
| 5,821,695 A | 10/1998 | Vilanilam et al. |
| 5,825,051 A | 10/1998 | Bauer et al. |
| 5,828,178 A | 10/1998 | York et al. |
| 5,836,676 A | 11/1998 | Ando et al. |
| 5,848,837 A | 12/1998 | Gustafson |
| 5,850,126 A | 12/1998 | Kanbar |
| 5,851,063 A | 12/1998 | Doughty et al. |
| 5,852,658 A | 12/1998 | Knight et al. |
| 5,854,542 A | 12/1998 | Forbes |
| RE36,030 E | 1/1999 | Nadeau |
| 5,859,508 A | 1/1999 | Ge et al. |
| 5,865,529 A | 2/1999 | Yan |
| 5,890,794 A | 4/1999 | Abtahi et al. |
| 5,896,010 A | 4/1999 | Mikolajczak et al. |
| 5,907,742 A | 5/1999 | Johnson et al. |
| 5,912,653 A | 6/1999 | Fitch |
| 5,921,660 A | 7/1999 | Yu |
| 5,924,784 A | 7/1999 | Chliwnyj et al. |
| 5,927,845 A | 7/1999 | Gustafson et al. |
| 5,934,792 A | 8/1999 | Camarota |
| 5,943,802 A | 8/1999 | Tijanic |
| 5,946,209 A | 8/1999 | Eckel et al. |
| 5,949,347 A | 9/1999 | Wu |
| 5,952,680 A | 9/1999 | Strite |
| 5,959,547 A | 9/1999 | Tubel et al. |
| 5,962,989 A | 10/1999 | Baker |
| 5,962,992 A | 10/1999 | Huang et al. |
| 5,963,185 A | 10/1999 | Havel |
| 5,974,553 A | 10/1999 | Gandar |
| 5,980,064 A | 11/1999 | Metroyanis |
| 5,998,925 A | 12/1999 | Shimizu et al. |
| 5,998,928 A | 12/1999 | Hipp |
| 6,007,209 A | 12/1999 | Pelka |
| 6,008,783 A | 12/1999 | Kitagawa et al. |
| 6,011,691 A | 1/2000 | Schreffler |
| 6,016,038 A | 1/2000 | Mueller et al. |
| 6,018,237 A | 1/2000 | Havel |
| 6,019,493 A | 2/2000 | Kuo et al. |
| 6,020,825 A | 2/2000 | Chansky et al. |
| 6,025,550 A | 2/2000 | Kato |
| 6,028,694 A | 2/2000 | Schmidt |
| 6,030,099 A | 2/2000 | McDermott |
| 6,031,343 A | 2/2000 | Recknagel et al. |
| D422,737 S | 4/2000 | Orozco |
| 6,056,420 A | 5/2000 | Wilson et al. |
| 6,068,383 A | 5/2000 | Robertson et al. |
| 6,069,597 A | 5/2000 | Hansen |
| 6,072,280 A | 6/2000 | Allen |
| 6,084,359 A | 7/2000 | Hetzel et al. |
| 6,086,220 A | 7/2000 | Lash et al. |
| 6,091,200 A | 7/2000 | Lenz |
| 6,092,915 A | 7/2000 | Rensch |
| 6,095,661 A | 8/2000 | Lebens et al. |
| 6,097,352 A | 8/2000 | Zavracky et al. |
| 6,116,748 A | 9/2000 | George |
| 6,121,875 A | 9/2000 | Hamm et al. |
| 6,127,783 A | 10/2000 | Pashley et al. |
| 6,132,072 A | 10/2000 | Turnbull et al. |
| 6,135,604 A | 10/2000 | Lin |
| 6,139,174 A | 10/2000 | Butterworth |
| 6,149,283 A | 11/2000 | Conway et al. |
| 6,150,774 A | 11/2000 | Mueller et al. |
| 6,151,529 A | 11/2000 | Batko |
| 6,153,985 A | 11/2000 | Grossman |
| 6,158,882 A | 12/2000 | Bischoff, Jr. |
| 6,166,496 A | 12/2000 | Lys et al. |
| 6,175,201 B1 | 1/2001 | Sid |
| 6,175,220 B1 | 1/2001 | Billig et al. |
| 6,181,126 B1 | 1/2001 | Havel |
| 6,183,086 B1 | 2/2001 | Neubert |
| 6,183,104 B1 | 2/2001 | Ferrara |
| 6,184,628 B1 | 2/2001 | Ruthenberg |
| 6,196,471 B1 | 3/2001 | Ruthenberg |
| 6,203,180 B1 | 3/2001 | Fleischmann |
| 6,211,626 B1 | 4/2001 | Lys et al. |
| 6,215,409 B1 | 4/2001 | Blach |

| Patent No. | Date | Inventor(s) |
|---|---|---|
| 6,217,190 B1 | 4/2001 | Altman et al. |
| 6,219,239 B1 | 4/2001 | Mellberg et al. |
| 6,227,679 B1 | 5/2001 | Zhang et al. |
| 6,238,075 B1 | 5/2001 | Dealey, Jr. et al. |
| 6,241,359 B1 | 6/2001 | Lin |
| 6,250,774 B1 | 6/2001 | Begemann et al. |
| 6,252,350 B1 | 6/2001 | Alvarez |
| 6,252,358 B1 | 6/2001 | Xydis et al. |
| 6,268,600 B1 | 7/2001 | Nakamura et al. |
| 6,273,338 B1 | 8/2001 | White |
| 6,275,397 B1 | 8/2001 | McClain |
| 6,283,612 B1 | 9/2001 | Hunter |
| 6,292,901 B1 | 9/2001 | Lys et al. |
| 6,293,684 B1 | 9/2001 | Riblett |
| 6,297,724 B1 | 10/2001 | Bryans et al. |
| 6,305,109 B1 | 10/2001 | Lee |
| 6,305,821 B1 | 10/2001 | Hsieh et al. |
| 6,307,331 B1 | 10/2001 | Bonasia et al. |
| 6,310,590 B1 | 10/2001 | Havel |
| 6,323,832 B1 | 11/2001 | Nishizawa et al. |
| 6,325,651 B1 | 12/2001 | Nishihara et al. |
| 6,334,699 B1 | 1/2002 | Gladnick |
| 6,340,868 B1 | 1/2002 | Lys et al. |
| 6,354,714 B1 | 3/2002 | Rhodes |
| 6,361,186 B1 | 3/2002 | Slayden |
| 6,369,525 B1 | 4/2002 | Chang et al. |
| 6,371,637 B1 | 4/2002 | Atchinson et al. |
| 6,379,022 B1 | 4/2002 | Amerson et al. |
| D457,667 S | 5/2002 | Piepgras et al. |
| D457,669 S | 5/2002 | Piepgras et al. |
| D457,974 S | 5/2002 | Piepgras et al. |
| 6,388,393 B1 | 5/2002 | Illingworth |
| 6,394,623 B1 | 5/2002 | Tsui |
| D458,395 S | 6/2002 | Piepgras et al. |
| 6,400,096 B1 | 6/2002 | Wells et al. |
| 6,404,131 B1 | 6/2002 | Kawano et al. |
| 6,411,022 B1 | 6/2002 | Machida |
| 6,422,716 B2 | 7/2002 | Henrici et al. |
| 6,428,189 B1 | 8/2002 | Hochstein |
| D463,610 S | 9/2002 | Piepgras et al. |
| 6,445,139 B1 | 9/2002 | Marshall et al. |
| 6,448,550 B1 | 9/2002 | Nishimura |
| 6,448,716 B1 | 9/2002 | Hutchison |
| 6,459,919 B1 | 10/2002 | Lys et al. |
| 6,469,457 B2 | 10/2002 | Callahan |
| 6,471,388 B1 | 10/2002 | Marsh |
| 6,472,823 B2 | 10/2002 | Yen |
| 6,473,002 B1 | 10/2002 | Hutchison |
| D468,035 S | 12/2002 | Blanc et al. |
| 6,488,392 B1 | 12/2002 | Lu |
| 6,495,964 B1 | 12/2002 | Muthu et al. |
| 6,527,411 B1 | 3/2003 | Sayers |
| 6,528,954 B1 | 3/2003 | Lys et al. |
| 6,528,958 B2 | 3/2003 | Hulshof et al. |
| 6,538,375 B1 | 3/2003 | Duggal et al. |
| 6,548,967 B1 | 4/2003 | Dowling et al. |
| 6,568,834 B1 | 5/2003 | Scianna |
| 6,573,536 B1 | 6/2003 | Dry |
| 6,577,072 B2 | 6/2003 | Saito et al. |
| 6,577,080 B2 | 6/2003 | Lys et al. |
| 6,577,512 B2 | 6/2003 | Tripathi et al. |
| 6,577,794 B1 | 6/2003 | Currie et al. |
| 6,578,979 B2 | 6/2003 | Truttmann-Battig |
| 6,582,103 B1 | 6/2003 | Popovich et al. |
| 6,583,550 B2 | 6/2003 | Iwasa et al. |
| 6,583,573 B2 | 6/2003 | Bierman |
| 6,585,393 B1 | 7/2003 | Brandes et al. |
| 6,586,890 B2 | 7/2003 | Min et al. |
| 6,590,343 B2 | 7/2003 | Pederson |
| 6,592,238 B2 | 7/2003 | Cleaver et al. |
| 6,596,977 B2 | 7/2003 | Muthu et al. |
| 6,598,996 B1 | 7/2003 | Lodhie |
| 6,608,453 B2 | 8/2003 | Morgan et al. |
| 6,608,614 B1 | 8/2003 | Johnson |
| 6,609,804 B2 | 8/2003 | Nolan et al. |
| 6,612,712 B2 | 9/2003 | Nepil |
| 6,612,717 B2 | 9/2003 | Yen |
| 6,621,222 B1 | 9/2003 | Hong |
| 6,623,151 B2 | 9/2003 | Pederson |
| 6,624,597 B2 | 9/2003 | Dowling et al. |
| D481,484 S | 10/2003 | Cuevas et al. |
| 6,634,770 B2 | 10/2003 | Cao |
| 6,634,779 B2 | 10/2003 | Reed |
| 6,636,003 B2 | 10/2003 | Rahm et al. |
| 6,639,349 B1 | 10/2003 | Bahadur |
| 6,641,284 B2 | 11/2003 | Stopa et al. |
| 6,659,622 B2 | 12/2003 | Katogi et al. |
| 6,660,935 B2 | 12/2003 | Southard et al. |
| 6,666,689 B1 | 12/2003 | Savage, Jr. |
| 6,667,623 B2 | 12/2003 | Bourgault et al. |
| 6,674,096 B2 | 1/2004 | Sommers |
| 6,676,284 B1 | 1/2004 | Wynne |
| 6,679,621 B2 | 1/2004 | West et al. |
| 6,681,154 B2 | 1/2004 | Nierlich et al. |
| 6,682,205 B2 | 1/2004 | Lin |
| 6,683,419 B2 | 1/2004 | Kriparos |
| 6,700,136 B2 | 3/2004 | Guida |
| 6,712,486 B1 | 3/2004 | Popovich et al. |
| 6,717,376 B2 | 4/2004 | Lys et al. |
| 6,717,526 B2 | 4/2004 | Martineau et al. |
| 6,720,745 B2 | 4/2004 | Lys et al. |
| 6,726,348 B2 | 4/2004 | Gloisten |
| 6,741,324 B1 | 5/2004 | Kim |
| D491,678 S | 6/2004 | Piepgras |
| D492,042 S | 6/2004 | Piepgras |
| 6,744,223 B2 | 6/2004 | Laflamme et al. |
| 6,748,299 B1 | 6/2004 | Motoyama |
| 6,762,562 B2 | 7/2004 | Leong |
| 6,774,584 B2 | 8/2004 | Lys et al. |
| 6,777,891 B2 | 8/2004 | Lys et al. |
| 6,781,329 B2 | 8/2004 | Mueller et al. |
| 6,787,999 B2 | 9/2004 | Stimac et al. |
| 6,788,000 B2 | 9/2004 | Appelberg et al. |
| 6,788,011 B2 | 9/2004 | Mueller et al. |
| 6,791,840 B2 | 9/2004 | Chun |
| 6,796,680 B1 | 9/2004 | Showers et al. |
| 6,801,003 B2 | 10/2004 | Schanberger et al. |
| 6,803,732 B2 | 10/2004 | Kraus et al. |
| 6,806,659 B1 | 10/2004 | Mueller et al. |
| 6,814,470 B2 | 11/2004 | Rizkin et al. |
| 6,815,724 B2 | 11/2004 | Dry |
| 6,846,094 B2 | 1/2005 | Luk |
| 6,851,816 B2 | 2/2005 | Wu et al. |
| 6,851,832 B2 | 2/2005 | Tieszen |
| 6,853,150 B2 | 2/2005 | Clauberg et al. |
| 6,853,151 B2 | 2/2005 | Leong et al. |
| 6,853,563 B1 | 2/2005 | Yang et al. |
| 6,857,924 B2 | 2/2005 | Fu et al. |
| 6,860,628 B2 | 3/2005 | Robertson et al. |
| 6,866,401 B2 | 3/2005 | Sommers et al. |
| 6,869,204 B2 | 3/2005 | Morgan et al. |
| 6,871,981 B2 | 3/2005 | Alexanderson et al. |
| 6,874,924 B1 | 4/2005 | Hulse et al. |
| 6,879,883 B1 | 4/2005 | Motoyama |
| 6,882,111 B2 | 4/2005 | Kan et al. |
| 6,883,929 B2 | 4/2005 | Dowling |
| 6,883,934 B2 | 4/2005 | Kawakami et al. |
| 6,888,322 B2 | 5/2005 | Dowling et al. |
| 6,897,624 B2 | 5/2005 | Lys et al. |
| 6,909,239 B2 | 6/2005 | Gauna |
| 6,909,921 B1 | 6/2005 | Bilger |
| 6,918,680 B2 | 7/2005 | Seeberger |
| 6,921,181 B2 | 7/2005 | Yen |
| 6,936,968 B2 | 8/2005 | Cross et al. |
| 6,936,978 B2 | 8/2005 | Morgan et al. |
| 6,940,230 B2 | 9/2005 | Myron et al. |
| 6,948,829 B2 | 9/2005 | Verdes et al. |
| 6,957,905 B1 | 10/2005 | Pritchard et al. |
| 6,963,175 B2 | 11/2005 | Archenhold et al. |
| 6,964,501 B2 | 11/2005 | Ryan |
| 6,965,197 B2 | 11/2005 | Tyan et al. |
| 6,965,205 B2 | 11/2005 | Piepgras et al. |
| 6,967,448 B2 | 11/2005 | Morgan et al. |
| 6,969,179 B2 | 11/2005 | Sloan et al. |
| 6,969,186 B2 | 11/2005 | Sonderegger et al. |
| 6,969,954 B2 | 11/2005 | Lys |
| 6,975,079 B2 | 12/2005 | Lys et al. |
| 6,979,097 B2 | 12/2005 | Elam et al. |

| | | |
|---|---|---|
| 6,982,518 B2 | 1/2006 | Chou et al. |
| 6,995,681 B2 | 2/2006 | Pederson |
| 6,997,576 B1 | 2/2006 | Lodhie et al. |
| 7,004,603 B2 | 2/2006 | Knight |
| D518,218 S | 3/2006 | Roberge et al. |
| 7,008,079 B2 | 3/2006 | Smith |
| 7,014,336 B1 | 3/2006 | Ducharme et al. |
| 7,015,650 B2 | 3/2006 | McGrath |
| 7,018,063 B2 | 3/2006 | Michael et al. |
| 7,021,799 B2 | 4/2006 | Mizuyoshi |
| 7,021,809 B2 | 4/2006 | Iwasa et al. |
| 7,024,256 B2 | 4/2006 | Krzyzanowski et al. |
| 7,031,920 B2 | 4/2006 | Dowling et al. |
| 7,033,036 B2 | 4/2006 | Pederson |
| 7,038,398 B1 | 5/2006 | Lys et al. |
| 7,038,399 B2 | 5/2006 | Lys et al. |
| 7,042,172 B2 | 5/2006 | Dowling et al. |
| 7,048,423 B2 | 5/2006 | Stepanenko et al. |
| 7,049,761 B2 | 5/2006 | Timmermans et al. |
| 7,052,171 B1 | 5/2006 | Lefebvre et al. |
| 7,053,557 B2 | 5/2006 | Cross et al. |
| 7,064,498 B2 | 6/2006 | Dowling et al. |
| 7,064,674 B2 | 6/2006 | Pederson |
| 7,067,992 B2 | 6/2006 | Leong et al. |
| 7,077,978 B2 | 7/2006 | Setlur et al. |
| 7,080,927 B2 | 7/2006 | Feuerborn et al. |
| 7,086,747 B2 | 8/2006 | Nielson et al. |
| 7,088,014 B2 | 8/2006 | Nierlich et al. |
| 7,088,904 B2 | 8/2006 | Ryan, Jr. |
| 7,102,902 B1 | 9/2006 | Brown et al. |
| 7,113,541 B1 | 9/2006 | Lys et al. |
| 7,114,830 B2 | 10/2006 | Robertson et al. |
| 7,114,834 B2 | 10/2006 | Rivas et al. |
| 7,118,262 B2 | 10/2006 | Negley |
| 7,119,503 B2 | 10/2006 | Kemper |
| 7,121,679 B2 | 10/2006 | Fujimoto |
| 7,122,976 B1 | 10/2006 | Null et al. |
| 7,128,442 B2 | 10/2006 | Lee et al. |
| 7,128,454 B2 | 10/2006 | Kim et al. |
| D532,532 S | 11/2006 | Maxik |
| 7,132,635 B2 | 11/2006 | Dowling |
| 7,132,785 B2 | 11/2006 | Ducharme |
| 7,132,804 B2 | 11/2006 | Lys et al. |
| 7,135,824 B2 | 11/2006 | Lys et al. |
| 7,139,617 B1 | 11/2006 | Morgan et al. |
| 7,144,135 B2 | 12/2006 | Martin et al. |
| 7,153,002 B2 | 12/2006 | Kim et al. |
| 7,161,311 B2 | 1/2007 | Mueller et al. |
| 7,161,313 B2 | 1/2007 | Piepgras et al. |
| 7,161,556 B2 | 1/2007 | Morgan et al. |
| 7,164,110 B2 | 1/2007 | Pitigoi-Aron et al. |
| 7,164,235 B2 | 1/2007 | Ito et al. |
| 7,165,863 B1 | 1/2007 | Thomas et al. |
| 7,165,866 B2 | 1/2007 | Li |
| 7,167,777 B2 | 1/2007 | Budike, Jr. |
| 7,168,843 B2 | 1/2007 | Striebel |
| D536,468 S | 2/2007 | Crosby |
| 7,178,941 B2 | 2/2007 | Roberge et al. |
| 7,180,252 B2 | 2/2007 | Lys et al. |
| D538,950 S | 3/2007 | Maxik |
| D538,952 S | 3/2007 | Maxik et al. |
| D538,962 S | 3/2007 | Elliott |
| 7,186,003 B2 | 3/2007 | Dowling et al. |
| 7,186,005 B2 | 3/2007 | Hulse |
| 7,187,141 B2 | 3/2007 | Mueller et al. |
| 7,190,126 B1 | 3/2007 | Paton |
| 7,192,154 B2 | 3/2007 | Becker |
| 7,198,387 B1 | 4/2007 | Gloisten et al. |
| 7,201,491 B2 | 4/2007 | Bayat et al. |
| 7,201,497 B2 | 4/2007 | Weaver, Jr. et al. |
| 7,202,613 B2 | 4/2007 | Morgan et al. |
| 7,204,615 B2 | 4/2007 | Arik et al. |
| 7,204,622 B2 | 4/2007 | Dowling et al. |
| 7,207,696 B1 | 4/2007 | Lin |
| 7,210,818 B2 | 5/2007 | Luk et al. |
| 7,210,957 B2 | 5/2007 | Mrakovich |
| 7,211,959 B1 | 5/2007 | Chou |
| 7,213,934 B2 | 5/2007 | Zarian et al. |
| 7,217,004 B2 | 5/2007 | Park et al. |
| 7,217,012 B2 | 5/2007 | Southard et al. |
| 7,217,022 B2 | 5/2007 | Ruffin |
| 7,218,056 B1 | 5/2007 | Harwood |
| 7,218,238 B2 | 5/2007 | Right et al. |
| 7,220,015 B2 | 5/2007 | Dowling |
| 7,220,018 B2 | 5/2007 | Crabb et al. |
| 7,221,104 B2 | 5/2007 | Lys et al. |
| 7,221,110 B2 | 5/2007 | Sears et al. |
| 7,224,000 B2 | 5/2007 | Aanegola et al. |
| 7,226,189 B2 | 6/2007 | Lee et al. |
| 7,228,052 B2 | 6/2007 | Lin |
| 7,228,190 B2 | 6/2007 | Dowling et al. |
| 7,231,060 B2 | 6/2007 | Dowling et al. |
| 7,233,115 B2 | 6/2007 | Lys |
| 7,233,831 B2 | 6/2007 | Blackwell |
| 7,236,366 B2 | 6/2007 | Chen |
| 7,237,924 B2 | 7/2007 | Martineau et al. |
| 7,237,925 B2 | 7/2007 | Mayer et al. |
| 7,239,532 B1 | 7/2007 | Hsu et al. |
| 7,241,038 B2 | 7/2007 | Naniwa et al. |
| 7,242,152 B2 | 7/2007 | Dowling et al. |
| 7,246,926 B2 | 7/2007 | Harwood |
| 7,246,931 B2 | 7/2007 | Hsieh et al. |
| 7,248,239 B2 | 7/2007 | Dowling et al. |
| 7,249,269 B1 | 7/2007 | Motoyama |
| 7,249,865 B2 | 7/2007 | Robertson |
| D548,868 S | 8/2007 | Roberge et al. |
| 7,252,408 B2 | 8/2007 | Mazzochette et al. |
| 7,253,566 B2 | 8/2007 | Lys et al. |
| 7,255,457 B2 | 8/2007 | Ducharme et al. |
| 7,255,460 B2 | 8/2007 | Lee |
| 7,256,554 B2 | 8/2007 | Lys |
| 7,258,458 B2 | 8/2007 | Mochiachvili et al. |
| 7,258,467 B2 | 8/2007 | Saccomanno et al. |
| 7,259,528 B2 | 8/2007 | Pilz |
| 7,262,439 B2 | 8/2007 | Setlur et al. |
| 7,264,372 B2 | 9/2007 | Maglica |
| 7,267,467 B2 | 9/2007 | Wu et al. |
| 7,270,443 B2 | 9/2007 | Kurtz et al. |
| 7,271,794 B1 | 9/2007 | Cheng et al. |
| 7,273,300 B2 | 9/2007 | Mrakovich |
| 7,274,045 B2 | 9/2007 | Chandran et al. |
| 7,274,160 B2 | 9/2007 | Mueller et al. |
| D553,267 S | 10/2007 | Yuen |
| 7,285,801 B2 | 10/2007 | Eliashevich et al. |
| 7,288,902 B1 | 10/2007 | Melanson |
| 7,296,912 B2 | 11/2007 | Beauchamp |
| 7,300,184 B2 | 11/2007 | Ichikawa et al. |
| 7,300,192 B2 | 11/2007 | Mueller et al. |
| D556,937 S | 12/2007 | Ly |
| D557,854 S | 12/2007 | Lewis |
| 7,303,300 B2 | 12/2007 | Dowling et al. |
| 7,306,353 B2 | 12/2007 | Popovich et al. |
| 7,307,391 B2 | 12/2007 | Shan |
| 7,308,296 B2 | 12/2007 | Lys et al. |
| 7,309,965 B2 | 12/2007 | Dowling et al. |
| 7,318,658 B2 | 1/2008 | Wang et al. |
| 7,319,244 B2 | 1/2008 | Liu et al. |
| 7,319,246 B2 | 1/2008 | Soules et al. |
| 7,321,191 B2 | 1/2008 | Setlur et al. |
| 7,326,964 B2 | 2/2008 | Lim et al. |
| 7,327,281 B2 | 2/2008 | Hutchison |
| 7,329,031 B2 | 2/2008 | Liaw et al. |
| D563,589 S | 3/2008 | Hariri et al. |
| 7,345,320 B2 | 3/2008 | Dahm |
| 7,348,604 B2 | 3/2008 | Matheson |
| 7,350,936 B2 | 4/2008 | Ducharme et al. |
| 7,350,952 B2 | 4/2008 | Nishigaki |
| 7,352,138 B2 | 4/2008 | Lys et al. |
| 7,352,339 B2 | 4/2008 | Morgan et al. |
| 7,353,071 B2 | 4/2008 | Blackwell et al. |
| 7,358,679 B2 | 4/2008 | Lys et al. |
| 7,358,929 B2 | 4/2008 | Mueller et al. |
| 7,374,327 B2 | 5/2008 | Schexnaider |
| 7,385,359 B2 | 6/2008 | Dowling et al. |
| 7,391,159 B2 | 6/2008 | Harwood |
| 7,396,146 B2 | 7/2008 | Wang |
| 7,401,935 B2 | 7/2008 | VanderSchuit |
| 7,401,945 B2 | 7/2008 | Zhang |

| | | | | | |
|---|---|---|---|---|---|
| 7,427,840 B2 | 9/2008 | Morgan et al. | 2003/0057887 A1 | 3/2003 | Dowling et al. |
| 7,429,117 B2 | 9/2008 | Pohlert et al. | 2003/0057890 A1 | 3/2003 | Lys et al. |
| 7,434,964 B1 | 10/2008 | Zheng et al. | 2003/0076281 A1 | 4/2003 | Morgan et al. |
| 7,438,441 B2 | 10/2008 | Sun et al. | 2003/0085710 A1 | 5/2003 | Bourgault et al. |
| D580,089 S | 11/2008 | Ly et al. | 2003/0095404 A1 | 5/2003 | Becks et al. |
| D581,556 S | 11/2008 | To et al. | 2003/0100837 A1 | 5/2003 | Lys et al. |
| 7,449,847 B2 | 11/2008 | Schanberger et al. | 2003/0102810 A1 | 6/2003 | Cross et al. |
| D582,577 S | 12/2008 | Yuen | 2003/0133292 A1 | 7/2003 | Mueller et al. |
| D584,428 S | 1/2009 | Li et al. | 2003/0137258 A1 | 7/2003 | Piepgras et al. |
| 7,476,002 B2 | 1/2009 | Wolf et al. | 2003/0185005 A1 | 10/2003 | Sommers et al. |
| 7,476,004 B2 | 1/2009 | Chan | 2003/0185014 A1 | 10/2003 | Gloisten |
| 7,478,924 B2 | 1/2009 | Robertson | 2003/0189412 A1 | 10/2003 | Cunningham |
| D586,484 S | 2/2009 | Liu et al. | 2003/0222587 A1 | 12/2003 | Dowling, Jr. et al. |
| D586,928 S | 2/2009 | Liu et al. | 2004/0003545 A1 | 1/2004 | Gillespie |
| 7,490,957 B2 | 2/2009 | Leong et al. | 2004/0012959 A1 | 1/2004 | Robertson et al. |
| 7,497,596 B2 | 3/2009 | Ge | 2004/0036006 A1 | 2/2004 | Dowling |
| 7,507,001 B2 | 3/2009 | Kit | 2004/0037088 A1 | 2/2004 | English et al. |
| 7,510,299 B2 | 3/2009 | Timmermans et al. | 2004/0052076 A1 | 3/2004 | Mueller et al. |
| 7,520,635 B2 | 4/2009 | Wolf et al. | 2004/0062041 A1 | 4/2004 | Cross et al. |
| 7,521,872 B2 | 4/2009 | Bruning | 2004/0075572 A1 | 4/2004 | Buschmann et al. |
| 7,524,089 B2 | 4/2009 | Park | 2004/0080960 A1 | 4/2004 | Wu |
| D592,766 S | 5/2009 | Zhu et al. | 2004/0090191 A1 | 5/2004 | Mueller et al. |
| D593,223 S | 5/2009 | Komar | 2004/0090787 A1 | 5/2004 | Dowling et al. |
| 7,534,002 B2 | 5/2009 | Yamaguchi et al. | 2004/0105261 A1 | 6/2004 | Ducharme et al. |
| 7,549,769 B2 | 6/2009 | Kim et al. | 2004/0105264 A1 | 6/2004 | Spero |
| 7,556,396 B2 | 7/2009 | Kuo et al. | 2004/0113568 A1 | 6/2004 | Dowling et al. |
| 7,572,030 B2 | 8/2009 | Booth et al. | 2004/0116039 A1 | 6/2004 | Mueller et al. |
| 7,575,339 B2 | 8/2009 | Hung | 2004/0124782 A1 | 7/2004 | Yu |
| 7,579,786 B2 | 8/2009 | Soos | 2004/0130909 A1 | 7/2004 | Mueller et al. |
| 7,583,035 B2 | 9/2009 | Shteynberg et al. | 2004/0141321 A1 | 7/2004 | Dowling et al. |
| 7,602,559 B2 | 10/2009 | Jang et al. | 2004/0155609 A1 | 8/2004 | Lys et al. |
| 7,619,366 B2 | 11/2009 | Diederiks | 2004/0160199 A1 | 8/2004 | Morgan et al. |
| 7,635,201 B2 | 12/2009 | Deng | 2004/0178751 A1 | 9/2004 | Mueller et al. |
| 7,635,214 B2 | 12/2009 | Perlo | 2004/0189218 A1 | 9/2004 | Leong et al. |
| 7,639,517 B2 | 12/2009 | Zhou et al. | 2004/0189262 A1 | 9/2004 | McGrath |
| D612,528 S | 3/2010 | McGrath et al. | 2004/0212320 A1 | 10/2004 | Dowling et al. |
| 7,690,813 B2 | 4/2010 | Kanamori et al. | 2004/0212321 A1 | 10/2004 | Lys et al. |
| 7,710,047 B2 | 5/2010 | Shteynberg et al. | 2004/0212993 A1 | 10/2004 | Morgan et al. |
| 7,712,918 B2 | 5/2010 | Siemiet et al. | 2004/0223328 A1 | 11/2004 | Lee et al. |
| 7,828,471 B2 | 11/2010 | Lin | 2004/0240890 A1 | 12/2004 | Lys et al. |
| 7,843,150 B2 | 11/2010 | Wang et al. | 2004/0251854 A1 | 12/2004 | Matsuda et al. |
| 8,159,152 B1 * | 4/2012 | Salessi ............ 315/309 | 2004/0257007 A1 | 12/2004 | Lys et al. |
| 2001/0033488 A1 | 10/2001 | Chliwnyj et al. | 2005/0013133 A1 | 1/2005 | Yeh |
| 2001/0045803 A1 | 11/2001 | Cencur | 2005/0024877 A1 | 2/2005 | Frederick |
| 2002/0011801 A1 | 1/2002 | Chang | 2005/0030744 A1 | 2/2005 | Ducharme et al. |
| 2002/0038157 A1 | 3/2002 | Dowling et al. | 2005/0035728 A1 | 2/2005 | Schanberger et al. |
| 2002/0044066 A1 | 4/2002 | Dowling et al. | 2005/0036300 A1 | 2/2005 | Dowling et al. |
| 2002/0047569 A1 | 4/2002 | Dowling et al. | 2005/0040774 A1 | 2/2005 | Mueller et al. |
| 2002/0047624 A1 | 4/2002 | Stam et al. | 2005/0041161 A1 | 2/2005 | Dowling et al. |
| 2002/0047628 A1 | 4/2002 | Morgan et al. | 2005/0041424 A1 | 2/2005 | Ducharme |
| 2002/0048169 A1 | 4/2002 | Dowling et al. | 2005/0043907 A1 | 2/2005 | Eckel et al. |
| 2002/0057061 A1 | 5/2002 | Mueller et al. | 2005/0044617 A1 | 3/2005 | Mueller et al. |
| 2002/0060526 A1 | 5/2002 | Timmermans et al. | 2005/0047132 A1 | 3/2005 | Dowling et al. |
| 2002/0070688 A1 | 6/2002 | Dowling et al. | 2005/0047134 A1 | 3/2005 | Mueller et al. |
| 2002/0074559 A1 | 6/2002 | Dowling et al. | 2005/0062440 A1 | 3/2005 | Lys et al. |
| 2002/0074958 A1 | 6/2002 | Crenshaw | 2005/0063194 A1 | 3/2005 | Lys et al. |
| 2002/0078221 A1 | 6/2002 | Blackwell et al. | 2005/0078477 A1 | 4/2005 | Lo |
| 2002/0101197 A1 | 8/2002 | Lys et al. | 2005/0099824 A1 | 5/2005 | Dowling et al. |
| 2002/0113555 A1 | 8/2002 | Lys et al. | 2005/0107694 A1 | 5/2005 | Jansen et al. |
| 2002/0130627 A1 | 9/2002 | Morgan et al. | 2005/0110384 A1 | 5/2005 | Peterson |
| 2002/0145394 A1 | 10/2002 | Morgan et al. | 2005/0116667 A1 | 6/2005 | Mueller et al. |
| 2002/0145869 A1 | 10/2002 | Dowling | 2005/0128751 A1 | 6/2005 | Roberge et al. |
| 2002/0152045 A1 | 10/2002 | Dowling et al. | 2005/0141225 A1 | 6/2005 | Striebel |
| 2002/0152298 A1 | 10/2002 | Kikta et al. | 2005/0151489 A1 | 7/2005 | Lys et al. |
| 2002/0153851 A1 | 10/2002 | Morgan et al. | 2005/0151663 A1 | 7/2005 | Tanguay |
| 2002/0158583 A1 | 10/2002 | Lys et al. | 2005/0154494 A1 | 7/2005 | Ahmed |
| 2002/0163316 A1 | 11/2002 | Lys et al. | 2005/0174473 A1 | 8/2005 | Morgan et al. |
| 2002/0171365 A1 | 11/2002 | Morgan et al. | 2005/0174780 A1 | 8/2005 | Park |
| 2002/0171377 A1 | 11/2002 | Mueller et al. | 2005/0184667 A1 | 8/2005 | Sturman et al. |
| 2002/0171378 A1 | 11/2002 | Morgan et al. | 2005/0201112 A1 | 9/2005 | Machi et al. |
| 2002/0176259 A1 | 11/2002 | Ducharme | 2005/0206529 A1 | 9/2005 | St.-Germain |
| 2002/0179816 A1 | 12/2002 | Haines et al. | 2005/0213320 A1 | 9/2005 | Kazuhiro et al. |
| 2002/0195975 A1 | 12/2002 | Schanberger et al. | 2005/0213352 A1 | 9/2005 | Lys |
| 2003/0011538 A1 | 1/2003 | Lys et al. | 2005/0213353 A1 | 9/2005 | Lys |
| 2003/0028260 A1 | 2/2003 | Blackwell | 2005/0218838 A1 | 10/2005 | Lys |
| 2003/0031015 A1 | 2/2003 | Ishibashi | 2005/0218870 A1 | 10/2005 | Lys |
| 2003/0048641 A1 | 3/2003 | Alexanderson et al. | 2005/0219860 A1 | 10/2005 | Schexnaider |
| 2003/0057884 A1 | 3/2003 | Dowling et al. | 2005/0219872 A1 | 10/2005 | Lys |
| 2003/0057886 A1 | 3/2003 | Lys et al. | 2005/0225979 A1 | 10/2005 | Robertson et al. |

| | | | | | | |
|---|---|---|---|---|---|---|
| 2005/0231133 A1 | 10/2005 | Lys | | 2007/0153514 A1 | 7/2007 | Dowling et al. |
| 2005/0236029 A1 | 10/2005 | Dowling | | 2007/0159828 A1 | 7/2007 | Wang |
| 2005/0236998 A1 | 10/2005 | Mueller et al. | | 2007/0165402 A1 | 7/2007 | Weaver, Jr. et al. |
| 2005/0248299 A1 | 11/2005 | Chemel et al. | | 2007/0173978 A1 | 7/2007 | Fein et al. |
| 2005/0253533 A1 | 11/2005 | Lys et al. | | 2007/0177382 A1 | 8/2007 | Pritchard et al. |
| 2005/0265019 A1 | 12/2005 | Sommers et al. | | 2007/0182387 A1 | 8/2007 | Weirich |
| 2005/0275626 A1 | 12/2005 | Mueller et al. | | 2007/0188114 A1 | 8/2007 | Lys et al. |
| 2005/0276051 A1 | 12/2005 | Caudle et al. | | 2007/0188427 A1 | 8/2007 | Lys et al. |
| 2005/0276053 A1 | 12/2005 | Nortrup et al. | | 2007/0189026 A1 | 8/2007 | Chemel et al. |
| 2005/0276064 A1 | 12/2005 | Wu et al. | | 2007/0195526 A1 | 8/2007 | Dowling et al. |
| 2005/0285547 A1 | 12/2005 | Piepgras et al. | | 2007/0195527 A1 | 8/2007 | Russell |
| 2006/0002110 A1 | 1/2006 | Dowling et al. | | 2007/0195532 A1 | 8/2007 | Reisenauer et al. |
| 2006/0012987 A9 | 1/2006 | Ducharme et al. | | 2007/0205712 A1 | 9/2007 | Radkov et al. |
| 2006/0012997 A1 | 1/2006 | Catalano et al. | | 2007/0206375 A1 | 9/2007 | Piepgras et al. |
| 2006/0016960 A1 | 1/2006 | Morgan et al. | | 2007/0209254 A1 | 9/2007 | Perlo |
| 2006/0022214 A1 | 2/2006 | Morgan et al. | | 2007/0211463 A1 | 9/2007 | Chevalier et al. |
| 2006/0028155 A1 | 2/2006 | Young | | 2007/0228999 A1 | 10/2007 | Kit |
| 2006/0028837 A1 | 2/2006 | Mrakovich | | 2007/0235751 A1 | 10/2007 | Radkov et al. |
| 2006/0034078 A1 | 2/2006 | Kovacik et al. | | 2007/0236156 A1 | 10/2007 | Lys et al. |
| 2006/0050509 A9 | 3/2006 | Dowling et al. | | 2007/0237284 A1 | 10/2007 | Lys et al. |
| 2006/0050514 A1 | 3/2006 | Opolka | | 2007/0240346 A1 | 10/2007 | Li et al. |
| 2006/0076908 A1 | 4/2006 | Morgan et al. | | 2007/0241657 A1 | 10/2007 | Radkov et al. |
| 2006/0092640 A1 | 5/2006 | Li | | 2007/0242466 A1 | 10/2007 | Wu et al. |
| 2006/0098077 A1 | 5/2006 | Dowling | | 2007/0247450 A1 | 10/2007 | Lee |
| 2006/0104058 A1 | 5/2006 | Chemel et al. | | 2007/0247842 A1 | 10/2007 | Zampini et al. |
| 2006/0109648 A1 | 5/2006 | Trenchard et al. | | 2007/0247847 A1 | 10/2007 | Villard |
| 2006/0109649 A1 | 5/2006 | Ducharme et al. | | 2007/0247851 A1 | 10/2007 | Villard |
| 2006/0109661 A1 | 5/2006 | Coushaine et al. | | 2007/0258231 A1 | 11/2007 | Koerner et al. |
| 2006/0126325 A1 | 6/2006 | Lefebvre et al. | | 2007/0258240 A1 | 11/2007 | Ducharme et al. |
| 2006/0126338 A1 | 6/2006 | Mighetto | | 2007/0263379 A1 | 11/2007 | Dowling |
| 2006/0132061 A1 | 6/2006 | McCormick et al. | | 2007/0274070 A1 | 11/2007 | Wedell |
| 2006/0132323 A1 | 6/2006 | Grady, Jr. | | 2007/0281520 A1 | 12/2007 | Insalaco et al. |
| 2006/0146531 A1 | 7/2006 | Reo et al. | | 2007/0285926 A1 | 12/2007 | Maxik |
| 2006/0152172 A9 | 7/2006 | Mueller et al. | | 2007/0285933 A1 | 12/2007 | Southard et al. |
| 2006/0158881 A1 | 7/2006 | Dowling | | 2007/0290625 A1 | 12/2007 | He et al. |
| 2006/0170376 A1 | 8/2006 | Piepgras et al. | | 2007/0291483 A1 | 12/2007 | Lys |
| 2006/0192502 A1 | 8/2006 | Brown et al. | | 2007/0296350 A1 | 12/2007 | Maxik et al. |
| 2006/0193131 A1 | 8/2006 | McGrath et al. | | 2008/0003664 A1 | 1/2008 | Tysoe et al. |
| 2006/0197661 A1 | 9/2006 | Tracy et al. | | 2008/0007945 A1 | 1/2008 | Kelly et al. |
| 2006/0198128 A1 | 9/2006 | Piepgras et al. | | 2008/0012502 A1 | 1/2008 | Lys |
| 2006/0208667 A1 | 9/2006 | Lys et al. | | 2008/0012506 A1 | 1/2008 | Mueller et al. |
| 2006/0220595 A1 | 10/2006 | Lu | | 2008/0013316 A1 | 1/2008 | Chiang |
| 2006/0221606 A1 | 10/2006 | Dowling | | 2008/0013324 A1 | 1/2008 | Yu |
| 2006/0221619 A1 | 10/2006 | Nishigaki | | 2008/0018261 A1 | 1/2008 | Kastner |
| 2006/0232974 A1 | 10/2006 | Lee et al. | | 2008/0024067 A1 | 1/2008 | Ishibashi |
| 2006/0262516 A9 | 11/2006 | Dowling et al. | | 2008/0037226 A1 | 2/2008 | Shin et al. |
| 2006/0262521 A1 | 11/2006 | Piepgras et al. | | 2008/0037245 A1 | 2/2008 | Chan |
| 2006/0262544 A1 | 11/2006 | Piepgras et al. | | 2008/0037284 A1 | 2/2008 | Rudisill |
| 2006/0262545 A1 | 11/2006 | Piepgras et al. | | 2008/0062680 A1 | 3/2008 | Timmermans et al. |
| 2006/0265921 A1 | 11/2006 | Korall et al. | | 2008/0089075 A1 | 4/2008 | Hsu |
| 2006/0273741 A1 | 12/2006 | Stalker, III | | 2008/0092800 A1 | 4/2008 | Smith et al. |
| 2006/0274529 A1 | 12/2006 | Cao | | 2008/0093615 A1 | 4/2008 | Lin et al. |
| 2006/0285325 A1 | 12/2006 | Ducharme et al. | | 2008/0093998 A1 | 4/2008 | Dennery et al. |
| 2007/0035255 A1 | 2/2007 | Shuster et al. | | 2008/0094837 A1 | 4/2008 | Dobbins et al. |
| 2007/0035538 A1 | 2/2007 | Garcia et al. | | 2008/0130267 A1 | 6/2008 | Dowling et al. |
| 2007/0035965 A1 | 2/2007 | Holst | | 2008/0151535 A1 | 6/2008 | de Castris |
| 2007/0040516 A1 | 2/2007 | Chen | | 2008/0158871 A1 | 7/2008 | McAvoy et al. |
| 2007/0041220 A1 | 2/2007 | Lynch | | 2008/0158887 A1 | 7/2008 | Zhu et al. |
| 2007/0047227 A1 | 3/2007 | Ducharme | | 2008/0164826 A1 | 7/2008 | Lys |
| 2007/0053182 A1 | 3/2007 | Robertson | | 2008/0164827 A1 | 7/2008 | Lys |
| 2007/0053208 A1 | 3/2007 | Justel et al. | | 2008/0164854 A1 | 7/2008 | Lys |
| 2007/0064419 A1 | 3/2007 | Gandhi | | 2008/0175003 A1 | 7/2008 | Tsou et al. |
| 2007/0070621 A1 | 3/2007 | Rivas et al. | | 2008/0180036 A1 | 7/2008 | Garrity et al. |
| 2007/0070631 A1 | 3/2007 | Huang et al. | | 2008/0186704 A1 | 8/2008 | Chou et al. |
| 2007/0081423 A1 | 4/2007 | Chien | | 2008/0192436 A1 | 8/2008 | Peng et al. |
| 2007/0086754 A1 | 4/2007 | Lys et al. | | 2008/0198598 A1 | 8/2008 | Ward |
| 2007/0086912 A1 | 4/2007 | Dowling et al. | | 2008/0211386 A1 | 9/2008 | Choi et al. |
| 2007/0097678 A1 | 5/2007 | Yang | | 2008/0211419 A1 | 9/2008 | Garrity |
| 2007/0109763 A1 | 5/2007 | Wolf et al. | | 2008/0218993 A1 | 9/2008 | Li |
| 2007/0115658 A1 | 5/2007 | Mueller et al. | | 2008/0224629 A1 | 9/2008 | Melanson |
| 2007/0115665 A1 | 5/2007 | Mueller et al. | | 2008/0224636 A1 | 9/2008 | Melanson |
| 2007/0120594 A1 | 5/2007 | Balakrishnan et al. | | 2008/0253125 A1 | 10/2008 | Kang et al. |
| 2007/0127234 A1 | 6/2007 | Jervey, III | | 2008/0258647 A1 | 10/2008 | Scianna |
| 2007/0133202 A1 | 6/2007 | Huang et al. | | 2008/0285257 A1 | 11/2008 | King |
| 2007/0139938 A1 | 6/2007 | Petroski et al. | | 2008/0285266 A1 | 11/2008 | Thomas |
| 2007/0145915 A1 | 6/2007 | Roberge et al. | | 2008/0290814 A1 | 11/2008 | Leong et al. |
| 2007/0147046 A1 | 6/2007 | Arik et al. | | 2008/0291675 A1 | 11/2008 | Lin et al. |
| 2007/0152797 A1 | 7/2007 | Chemel et al. | | 2008/0315773 A1 | 12/2008 | Pang |
| 2007/0152808 A1 | 7/2007 | LaCasse | | 2008/0315784 A1 | 12/2008 | Tseng |

| | | | |
|---|---|---|---|
| 2009/0002995 A1 | 1/2009 | Lee et al. | |
| 2009/0016063 A1 | 1/2009 | Hu | |
| 2009/0021140 A1 | 1/2009 | Takasu et al. | |
| 2009/0046473 A1 | 2/2009 | Tsai et al. | |
| 2009/0052186 A1 | 2/2009 | Xue | |
| 2009/0067182 A1 | 3/2009 | Hsu et al. | |
| 2009/0086492 A1 | 4/2009 | Meyer | |
| 2009/0091938 A1 | 4/2009 | Jacobson et al. | |
| 2009/0140285 A1 | 6/2009 | Lin et al. | |
| 2009/0175041 A1 | 7/2009 | Yuen et al. | |
| 2009/0185373 A1 | 7/2009 | Grajcar | |
| 2009/0195186 A1 | 8/2009 | Guest et al. | |
| 2009/0196034 A1 | 8/2009 | Gherardini et al. | |
| 2009/0213588 A1 | 8/2009 | Manes | |
| 2009/0273926 A1 | 11/2009 | Deng | |
| 2009/0303720 A1 | 12/2009 | McGrath | |
| 2009/0316408 A1 | 12/2009 | Villard | |
| 2005/0259424 A1 | 1/2010 | Zampini, II et al. | |
| 2010/0008085 A1 | 1/2010 | Ivey et al. | |
| 2010/0019689 A1 | 1/2010 | Shan | |
| 2010/0027259 A1 | 2/2010 | Simon et al. | |
| 2010/0033095 A1 | 2/2010 | Sadwick | |
| 2010/0033964 A1 | 2/2010 | Choi et al. | |
| 2010/0096992 A1 | 4/2010 | Yamamoto et al. | |
| 2010/0096998 A1 | 4/2010 | Beers | |
| 2010/0103664 A1 | 4/2010 | Simon et al. | |
| 2010/0109550 A1 | 5/2010 | Huda et al. | |
| 2010/0109558 A1 | 5/2010 | Chew | |
| 2010/0164404 A1 | 7/2010 | Shao et al. | |
| 2010/0265732 A1 | 10/2010 | Liu | |
| 2010/0277069 A1 | 11/2010 | Janik et al. | |
| 2010/0289418 A1 | 11/2010 | Langovsky | |

FOREIGN PATENT DOCUMENTS

| | | | |
|---|---|---|---|
| CN | 2869556 Y | 2/2007 | |
| EP | 0013782 B1 | 3/1983 | |
| EP | 0091172 A2 | 10/1983 | |
| EP | 0124924 B1 | 9/1987 | |
| EP | 0174699 B1 | 11/1988 | |
| EP | 0197602 B1 | 11/1990 | |
| EP | 0214701 B1 | 3/1992 | |
| EP | 0262713 B1 | 6/1992 | |
| EP | 0203668 B1 | 2/1993 | |
| EP | 0272749 B1 | 8/1993 | |
| EP | 0337567 B1 | 11/1993 | |
| EP | 0390262 B1 | 12/1993 | |
| EP | 0359329 B1 | 3/1994 | |
| EP | 0403011 B1 | 4/1994 | |
| EP | 0632511 A2 | 1/1995 | |
| EP | 0432848 B1 | 4/1995 | |
| EP | 0403001 B1 | 8/1995 | |
| EP | 0525876 B1 | 5/1996 | |
| EP | 0714556 B1 | 1/1999 | |
| EP | 0458408 B1 | 9/1999 | |
| EP | 0578302 B1 | 9/1999 | |
| EP | 0723701 B1 | 1/2000 | |
| EP | 0787419 B1 | 5/2001 | |
| EP | 1195740 A2 | 4/2002 | |
| EP | 1016062 B1 | 8/2002 | |
| EP | 1195740 A3 | 1/2003 | |
| EP | 1149510 B1 | 2/2003 | |
| EP | 1056993 B1 | 3/2003 | |
| EP | 0766436 B1 | 5/2003 | |
| EP | 0924281 B1 | 5/2003 | |
| EP | 0826167 B1 | 6/2003 | |
| EP | 1147686 B1 | 1/2004 | |
| EP | 1142452 B1 | 3/2004 | |
| EP | 1145602 B1 | 3/2004 | |
| EP | 1422975 A1 | 5/2004 | |
| EP | 0890059 B1 | 6/2004 | |
| EP | 1348319 B1 | 6/2005 | |
| EP | 1037862 B1 | 7/2005 | |
| EP | 1346609 B1 | 8/2005 | |
| EP | 1321012 B1 | 12/2005 | |
| EP | 1610593 A2 | 12/2005 | |
| EP | 1624728 A1 | 2/2006 | |
| EP | 1415517 B1 | 5/2006 | |
| EP | 1415518 B1 | 5/2006 | |
| EP | 1438877 B1 | 5/2006 | |
| EP | 1166604 B1 | 6/2006 | |
| EP | 1479270 B1 | 7/2006 | |
| EP | 1348318 B1 | 8/2006 | |
| EP | 1399694 B1 | 8/2006 | |
| EP | 1461980 B1 | 10/2006 | |
| EP | 1110120 B1 | 4/2007 | |
| EP | 1440604 B1 | 4/2007 | |
| EP | 1047903 B1 | 6/2007 | |
| EP | 1500307 B1 | 6/2007 | |
| EP | 0922305 B1 | 8/2007 | |
| EP | 0922306 B1 | 8/2007 | |
| EP | 1194918 B1 | 8/2007 | |
| EP | 1833035 A1 | 9/2007 | |
| EP | 1048085 B1 | 11/2007 | |
| EP | 1763650 B1 | 12/2007 | |
| EP | 1776722 B1 | 1/2008 | |
| EP | 1459599 B1 | 2/2008 | |
| EP | 1887836 A2 | 2/2008 | |
| EP | 1579733 B1 | 4/2008 | |
| EP | 1145282 B1 | 7/2008 | |
| EP | 1157428 B1 | 9/2008 | |
| EP | 1000522 B1 | 12/2008 | |
| EP | 1502483 B1 | 12/2008 | |
| EP | 1576858 B1 | 12/2008 | |
| EP | 1646092 B1 | 1/2009 | |
| EP | 1579736 B1 | 2/2009 | |
| EP | 1889519 B1 | 3/2009 | |
| EP | 1537354 B1 | 4/2009 | |
| EP | 1518445 B1 | 5/2009 | |
| EP | 1337784 B1 | 6/2009 | |
| EP | 2013530 B1 | 8/2009 | |
| EP | 1461982 B1 | 9/2009 | |
| GB | 2215024 A | 9/1989 | |
| GB | 2324901 A | 11/1998 | |
| JP | 06-054289 | 2/1994 | |
| JP | 6-54103 U | 7/1994 | |
| JP | 08-162677 | 7/1994 | |
| JP | 7-249467 | 9/1995 | |
| JP | 7264036 | 10/1995 | |
| JP | 11-135274 A | 5/1999 | |
| JP | 2001-238272 A | 8/2001 | |
| JP | 2002-141555 A | 5/2002 | |
| JP | 3098271 U | 2/2004 | |
| JP | 2004119078 A | 4/2004 | |
| JP | 2004-335426 | 11/2004 | |
| JP | 2005-158363 A | 6/2005 | |
| JP | 2005-166617 A | 6/2005 | |
| JP | 2005-347214 | 12/2005 | |
| JP | 2006-507641 A | 3/2006 | |
| JP | 3139714 U | 2/2008 | |
| JP | 2008186758 A | 8/2008 | |
| JP | 2008-258124 A | 10/2008 | |
| JP | 2008293753 A | 12/2008 | |
| KR | 10-2004-0008244 A | 1/2004 | |
| KR | 20-0430022 Y1 | 11/2006 | |
| KR | 10-0781652 B1 | 12/2007 | |
| KR | 100844538 B1 | 7/2008 | |
| KR | 100888669 B1 | 3/2009 | |
| TW | M337036 | 7/2008 | |
| WO | 9906759 A1 | 2/1999 | |
| WO | 99/10867 A1 | 3/1999 | |
| WO | 99/31560 A2 | 6/1999 | |
| WO | 9945312 A1 | 9/1999 | |
| WO | 00/01067 A2 | 1/2000 | |
| WO | 2006056120 A1 | 1/2001 | |
| WO | 02/25842 A2 | 3/2002 | |
| WO | 02/061330 A2 | 8/2002 | |
| WO | 02/069306 A2 | 9/2002 | |
| WO | 02/091805 A2 | 11/2002 | |
| WO | 02/098182 A2 | 12/2002 | |
| WO | 02/099780 A2 | 12/2002 | |
| WO | 03/026358 A1 | 3/2003 | |
| WO | 03/055273 A2 | 7/2003 | |
| WO | 03/067934 A2 | 8/2003 | |
| WO | 03/090890 A1 | 11/2003 | |
| WO | 03/096761 A1 | 11/2003 | |
| WO | 2004/021747 A2 | 3/2004 | |
| WO | 2004/023850 A2 | 3/2004 | |
| WO | 2004/032572 A2 | 4/2004 | |

| | | | |
|---|---|---|---|
| WO | 2004057924 A1 | 7/2004 |
| WO | 2004/100624 A2 | 11/2004 |
| WO | 2005031860 A2 | 4/2005 |
| WO | 2005/052751 A2 | 6/2005 |
| WO | 2005/060309 A2 | 6/2005 |
| WO | 2005/084339 A2 | 9/2005 |
| WO | 2005/089293 A2 | 9/2005 |
| WO | 2005/089309 A2 | 9/2005 |
| WO | 2006/023149 A2 | 3/2006 |
| WO | 2006044328 A1 | 4/2006 |
| WO | 2006/093889 A2 | 9/2006 |
| WO | 2006/127666 A2 | 11/2006 |
| WO | 2006/127785 A2 | 11/2006 |
| WO | 2006/133272 A2 | 12/2006 |
| WO | 2006137686 A1 | 12/2006 |
| WO | 2007/081674 A1 | 7/2007 |
| WO | 2007/094810 A2 | 8/2007 |
| WO | 2007090292 A1 | 8/2007 |
| WO | 2008137460 A2 | 11/2008 |
| WO | 9957945 A1 | 9/2009 |
| WO | 2010014437 A2 | 2/2010 |
| WO | 2010/030509 A2 | 3/2010 |

OTHER PUBLICATIONS

Wolsey, Robert. Interoperable Systems: The Future of Lighting Control, Lighting Research Center, Jan. 1, 1997, vol. 2 No. 2, Rensselaer Polytechnic Institute, Troy, New York [online]. Retrieved Lighting Research Center Web Page using Internet <URL: http://www.lrc.rpi.edu/programs/Futures/LF-BAS/index.asp>.
Experiment Electronic Ballast. Electronic Ballast for Fluorescent Lamps [online], Revised Fall of 2007. [Retrieved on Jan. 9, 1997]. Retrieved from Virginia Tech Web Page using Internet <URL: http://www.ece.vt.edu/ece3354/labs/ballast.pdf.>.
Truck-Lite, LEDSelect—LED, Model 35, Clearance & Marker Lighting, [online], [retrieved on Jan. 13, 2000] Retrieved from Truck-Lite Web Page using Internet <URL: http://trucklite.com/ledsl4.html>.
Truck-Lite, LEDSelect—LED, Super 44, Stop, Turn & Tail Lighting, [online], [retrieved on Jan. 13, 2000] Retrieved from Truck-Lite Web Page using Internet <URL: http://trucklite.com/leds2.html>.
Truck-Lite, LEDSelect - Led, Model 45, Stop, Turn & Tail Lighting [online], [retrieved on Jan. 13, 2000] Retrieved from Truck-Lite Web Page using Internet <URL: http://trucklite.com/leds4.html>.
Telecite Products & Services—Display Options, [online], [retrieved on Jan. 13, 2000] Retrieved from Telecite Web page using Internet <URL: http://www.telecite.com/en/products/options en.htm>.
Traffic Signal Products—Transportation Products Group, [online], [retrieved on Jan. 13, 2000] Retrieved from the Dialight Web Page using Internet <URL: http://www.dialight.com/trans.htm>.
LED Lights, Replacement LED lamps for any incandescent light, [online], [retrieved on Jan. 13, 2000] Retrieved from LED Lights Web Page using Internet <URL: http://www.ledlights.com/replac.htm>.
Ledtronics, Ledtronics Catalog, 1996, p. 10, Ledtronics, Torrance, California.
Piper. The Best Path to Efficiency. Building Operating Management, Trade Press Publishing Company May 2000 [online], [retrieved on Jan. 17, 2008]. Retrieved from Find Articles Web Page using Internet <URL:http://findarticles.com/p/articles/mi_qu3922/is_200005/ai_n8899499/>.
Henson, Keith. The Benefits of Building Systems Integration, Access Control & Security Systems Integration, Oct. 1, 2000, Penton Media. [online], [retrieved on Oct. 24, 2008] Retrieved from Security Solutions Web page using Internet <Url: http://securitysolutions.com/mag/security_benefits_building_systems/>.
Phason Electronic Control Systems, Light Level Controller (LLC) case study. Nov. 30, 2004. 3 pages, Phason Inc., Winnipeg, Manitoba, Canada.
Airport International. Fly High With Intelligent Airport Building and Security Solutions [online], [retrieved on Oct. 24, 2008]. Retrieved from Airport International web page using Internet <URL: http://www.airport-int.com/.categories/airport-building-and-security-solutions/fly-high-with-intelligent-airport-building-and-security-solutions.html>.

D.N.A -III [online], [retrieved Mar. 10, 2009] Retrieved from the PLC Lighting Web Page using Internet <URL: http://www.plclighting.com/product_info.php?cPath=1&products_id=92>.
E20116-18 Larmes Collection, [online], [retrieved on Jul. 10, 2010] Retrieved from ET2 Contemporary Lighting using Internet <URL: http://www.et2online.com/proddetail.aspx?ItemID=E20116-18>.
E20112-22 Starburst Collection, [online], [retrieved on Jul. 10, 2010] Retrieved from ET2 Contemporary Lighting using Internet <URL: http://www.et2online.com/proddetail.aspx?ItemID=E20112-22>.
E20524-10 & E20525-10 Curve Collection, [online], [retrieved on Jul. 10, 2010] Retrieved from ET2 Contemporary Lighting using Internet <URL: http://www.et2online.com/proddetail.aspx?ItemID=E20524-10 & E20525-10>.
E22201-44 Esprit Collection, [online], [retrieved on Jul. 10, 2010] Retrieved from ET2 Contemporary Lighting using Internet <URL: http://www.et2online.com/proddetail.aspx?ItemID=E22201-44>.
E20743-09 Stealth Collection, [online], [retrieved on Jul. 10, 2010] Retrieved from ET2 Contemporary Lighting using Internet <URL: http://www.et2online.com/proddetail.aspx?ItemID=E20743-09>.
Spencer, Eugene. High Sales, Low Utilization. Green Intelligent Buildings, Feb. 1, 2007. [online]. Retrieved from Green Intelligent Buildings web page using Internet <URL: http://www.greenintelligentbuildings.com/CDA/IBT_Archive/BNP_GUID_9-5-2006_A_10000000000000056772>.
Sensor Switch, nLight Lighting Control System, [online], [retrieved on Nov. 1, 2008] Retrieved from Sensor Switch web page using Internet <URL: http://www.sensorswitch.com>.
Six Strategies, [online], [retrieved on Nov. 1, 2008] Retrieved from Encelium Technologies Inc. Web Page using Internet <URL: http://www.encelium.com/products/strategies.html>.
Lawrence Berkeley National Laboratory. Lighting Control System—Phase Cut Carrier. University of California, [online] [retrieved on Jan. 14, 2008] Retrieved from Lawrence Berkeley National Laboratory web page using Internet <URL: http://www.lblgov/tt/techs/lbnl1871.html>.
Best Practice Guide—Commercial Office Buildings—Central HVAC System. [online], [Retrieved on Jan. 17, 2008]Retrieved from Flex Your Power Organization web page using Internet <URL: http://www.fypower.org/bpg/module.html?b=offices&m+Central HVAC Systems&s=Contr...>.
Cornell University. Light Canopy—Cornell University Solar Decathlon, [online], [retrieved on Jan. 17, 2008]Retrieved from Cornell University web page using Internet <URL: http://cusd.cornell.edu/cusd/web/index.php/page/show/section/Design/page/controls>.
PLC-96973-PC PLC Lighting Elegance Modern/Contemporary Pendant Light, [online], [retrieved on Feb. 27, 2009]Retrieved from the Arcadian Lighting Web Page using Internet <URL: http/www.arcadianlighting.com/plc-96978-pc.html>.
PLC-81756-AL "Fireball" Contemporary Pendant Light, [online], [retrieved on Feb. 27, 2009] Retrieved from the Arcadian Lighting Web Page using Internet <URL: http://www.arcadianlighting.com/plc-81756-al.html>.
Philips. Sense and Simplicity—Licensing program for LED Luminaires and Retrofits, Philips Intellectual Property & Standards, May 5, 2009.
International Search Report and Written Opinion dated Jul. 17, 2009 from the corresponding International Application No. PCT/US2008/085118 filed Dec. 1, 2008.
International Search Report and Written Opinion dated Aug. 25, 2009 from corresponding International Application No. PCT/US2009/031049 filed Jan. 15, 2009.
International Search Report and Written Opinion dated Jan. 4, 2010 from the corresponding International Application No. PCT/US2009/044313 filed May 18, 2009.
International Search Report and Written Opinion dated Jan. 25, 2010 from the corresponding International Application No. PCT/US2009/048623 filed Jun. 25, 2009.
International Search Report and Written Opinion dated Feb. 26, 2010 from the corresponding International Application No. PCT/US2009/050949 filed Jul. 17, 2009.
International Search Report and Written Opinion dated Mar. 22, 2010 from the corresponding International Application No. PCT/US2009/053853 filed Aug. 14, 2009.

International Search Report and Written Opinion dated May 14, 2010 from the corresponding International Application No. PCT/US2009/060085 filed Oct. 9, 2009.

International Search Report and Written Opinion dated May 24, 2010 from the corresponding International Application No. PCT/US2009/060087 filed Oct. 9, 2009.

International Search Report and Written Opinion dated May 24, 2010 from the corresponding International Application No. PCT/2009/060083 filed Oct. 9, 2009.

International Search Report and Written Opinion dated Jul. 16, 2009 from the corresponding International Application No. PCT/US2008/084650 filed Nov. 25, 2008.

International Search Report and Written Opinion dated Feb. 8, 2011 from the corresponding International Application No. PCT/US2010/039608 filed Jun. 23, 2010.

International Search Report and Written Opinion dated Dec. 24, 2010 from the corresponding International Application No. PCT/US2010/034635 filed May 13, 2010.

International Search Report and Written Opinion dated Feb. 7, 2011 from the corresponding International Application No. PCT/US2010/039678 filed Jun. 23, 2010.

International Search Report and Written Opinion dated Dec. 13, 2010 from the corresponding International Application No. PCT/US2010/037006 filed Jun. 2, 2010.

LCD Optics 101 Tutorial [online]. 3M Corporation, [retrieved on Jan. 6, 2010]. Retrieved from the internet: <URL: http://solutions.3m.com/wps/portal/3M/en_US/Vikuiti1/BrandProducts/secondary/optics101/>.

International Search Report and Written Opinion dated Jul. 30, 2010 from the corresponding International Application No. PCT/US2010/021448 filed on Jan. 20, 2010.

International Search Report and Written Opinion dated Aug. 16, 2010 from the corresponding International Application No. PCT/US2010/021131 filed on Jan. 15, 2010.

International Search Report and Written Opinion dated May 7, 2010 from the corresponding International Application No. PCT/US2009/057109 filed on Sep. 16, 2009.

International Search Report and Written Opinion dated Apr. 30, 2010 from the corresponding International Application No. PCT/US2009/057072 filed on Sep. 16, 2009.

International Search Report and Written Opinion dated Aug. 17, 2010 from the corresponding International Application No. PCT/US2010/021489 filed on Jan. 20, 2010.

International Search Report and Written Opinion dated Apr. 8, 2010 from the corresponding International Application No. PCT/2009/055114 filed on Aug. 27, 2009.

* cited by examiner

LED LIGHT WITH THERMOELECTRIC GENERATOR

CROSS REFERENCE TO RELATED APPLICATION

This application claims priority to U.S. Provisional Patent Application No. 61/317,841, filed Mar. 26, 2010, which is incorporated herein by reference in its entirety.

TECHNICAL FIELD

The invention relates to a light emitting diode (LED) based light, for example, an LED-based light tube usable in a fluorescent light fixture in place of a conventional fluorescent tube or an LED-based light bulb usable in an Edison-type fixture in place of a conventional incandescent bulb.

BACKGROUND

LED-based lights, also referred to as LED lights, have many advantages over other types of lights including incandescent lights and fluorescent lights. As examples, LED lights typically have a higher efficiency and longer lifespan than other types of lights. LEDs also typically do not present the same risks associated with hazardous materials found in mercury-containing fluorescent lights.

One factor limiting the performance of LED lights is the ability of the LED lights to dissipate heat produced by their respective LEDs, which can become damaged if overheated. To this end, LED lights each typically include some structure for dissipating heat, such as one or more of a high surface area heat sink constructed from a highly thermally conductive material, an internal fan for improving convective heat transfer, or some other structure. Ideally, according to known theories for dealing with heat produced by LEDs in LED lights, the structure for dissipating heat would dissipate all the heat produced by the LEDs of a respective LED light.

BRIEF SUMMARY

Contrary to the known approach of trying to dissipate all heat produced by LEDs of an LED light, such heat can be "recycled" to increase the efficiency of the LEDs. For example, the LED light can include a thermoelectric generator ("TEG"), such as a generator utilizing the Seeback effect. The TEG can be positioned in a path of heat originating at one or more of the LEDs, and the TEG can use heat produced by the LEDs to produce electrical energy that is fed back to the LEDs. In one disclosed example, an LED light includes multiple LEDs mounted on a printed circuit board. The LED light also includes multiple discrete TEGs and a heatsink, and the TEGs are positioned between the printed circuit board and the heat sink such that the TEGs are overlaid by the LEDs. The TEGs are in electric communication with the LEDs, and the TEGs are operable to produce an electrical energy in response to heat produced by the LEDs. The LEDs are operable to produce light at least in part in response to the electrical energy produced by the TEGs. In another example, a single TEG can be positioned between the circuit board and heat sink. As a result of using TEGs to turn heat produced by the LEDs into electrical energy that can in turn be used to power the LEDs, the efficiency of the LED light can be improved compared to an LED light that does not recycle heat into electrical energy.

One aspect of an LED based light disclosed herein comprises at least one LED and at least one thermoelectric generator having a first side and a second side. The first side is thermally coupled to the at least one LED such that heat generated by the at least one LED is conducted to the at least one thermoelectric generator, producing a temperature differential between the first side and second side. The at least one thermoelectric generator is configured to produce electrical energy from the temperature differential.

Another aspect of an LED based light disclosed herein is for use in a conventional lighting fixture and comprises a circuit board, at least one LED mounted on the circuit board and configured to receive electrical energy from a power source, and at least one thermoelectric generator configured to generate an electrical energy in response to heat received from the at least one LED. A power converter circuit is connected to the power source and configured to electrically connect the least one thermoelectric generator to the least one LED and to power the at least one LED with the electrical energy provided by the at least one thermoelectric generator.

Also disclosed herein at methods of powering an LED of an LED-based light. One method comprises supplying power provided by a power source to at least one LED and converting heat generated by the at least one LED to electrical energy with at least one thermoelectric generator in thermally conductive relation with the at least one LED. The at least one thermoelectric generator is electrically connected to the least one LED, and the electrical energy is supplied to the at least one LED from the electrically connected thermoelectric generator to supplement the power supplied by the power source.

BRIEF DESCRIPTION OF THE DRAWINGS

The description herein makes reference to the accompanying drawings wherein like reference numerals refer to like parts throughout the several views, and wherein.

DETAILED DESCRIPTION

Figure 1:
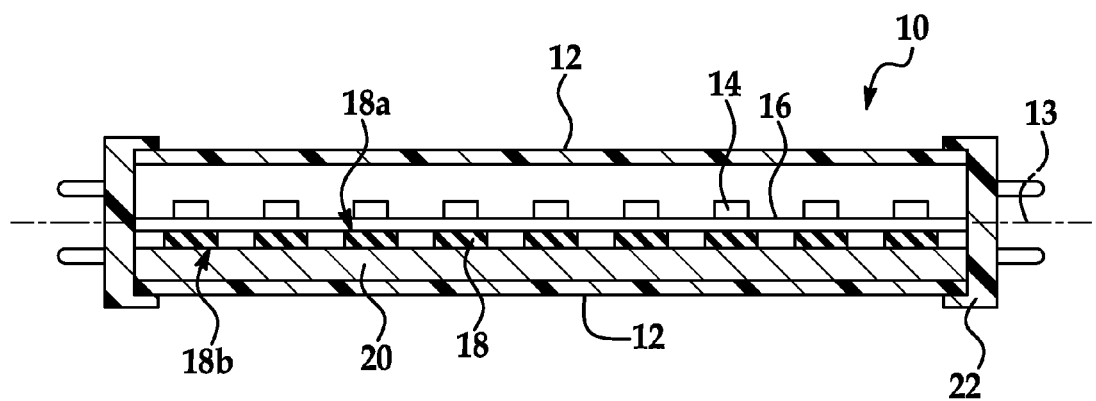
FIG. 1 is a cross section of an example of an LED-based light tube for use in a fluorescent light fixture taken along a plane including a longitudinal axis of the LED-based light tube.

An example of an LED-based light tube 10 configured as a replacement for a fluorescent tube in a fluorescent fixture is shown in FIG. 1. The light tube 10 includes a housing 12, multiple LEDs 14 mounted on a circuit board 16 disposed in the housing 12, multiple thermoelectric generators ("TEGs") 18 and two bi-pin end caps 22. The light tube 10 can also include other components, such as electrical components in a circuit between the end caps 22 and the circuit board 16, which are described in more detail below.

The housing 12 shown in FIG. 1 can include a light transmitting cylindrical tube defining a longitudinal axis 13. The housing 12 can be made from polycarbonate, acrylic, glass or another light transmitting material (i.e., the housing 12 can be transparent or translucent). For example, a translucent housing 12 can be made from a composite, such as polycarbonate with particles of a light refracting material interspersed in the polycarbonate. While the illustrated housing 12 is cylindrical, the housing 12 can alternatively have a square, triangular, polygonal, or other cross sectional shape. Similarly, while the illustrated housing 12 is linear, the housing 12 can have an alternative shape, e.g., a U-shape or a circular shape. Additionally, the housing 12 need not be a single piece as shown in FIG. 1. Instead, the housing 12 can be formed by attaching multiple individual parts, not all of which need be light transmitting. For example, the housing 12 can include a lower portion and a lens attached to the lower portion to cover the LEDs 14. The housing 12 can be manufactured to include light diffusing or refracting properties, such as by surface roughening or applying a diffusing film to the housing 12. The housing 12 can have a length such that the light tube 10 is approximately 48" long, and the housing 12 can have a 0.625", 1.0", or 1.5" diameter for engagement with common fluorescent fixtures.

The LEDs 14 can be surface-mount devices of a type available from Nichia, though other types of LEDs can alternatively be used. For example, although surface-mounted LEDs 14 are shown, one or more organic LEDs can be used in place of or in addition thereto. Each LED 14 can include a single diode or multiple diodes, such as a package of diodes producing light that appears to an ordinary observer as coming from a single source. The LEDs 14 can be mounted on and electrically connected to the circuit board 16 using, for example, solder or another type of connection. The LEDs 14 can emit white light. However, LEDs that emit blue light, ultra-violet light or other wavelengths of light can be used in place of white light emitting LEDs 14.

The number of LEDs 14 can be a function of the desired power of the light tube 10 and the power of the LEDs 14. For a 48" light, such as the light tube 10, the number of LEDs 14 can vary from about five to four hundred such that the light tube 10 outputs approximately 500 to 3,000 lumens. However, a different number of LEDs 14 can alternatively be used, and the light tube 10 can output another amount of lumens. The LEDs 14 can be evenly spaced along the circuit board 16 such that light tube 10 appears to produce an even distribution of light as judged by an ordinary observer. The spacing of the LEDs 14 can be determined based on, for example, the light distribution of each LED 14 and the number of LEDs 14.

The circuit board 16 as illustrated in FIG. 1 is an elongate printed circuit board. Multiple circuit board sections can be joined by bridge connectors to create the circuit board 16. The circuit board 16 as shown in FIG. 1 is slidably engaged with longitudinally extending slots formed in the housing 12, though the circuit board 16 can alternatively be clipped, adhered, snap- or friction-fit, screwed or otherwise connected to the housing 12 or another structure such as a heat sink or end caps 22. Also, other types of circuit boards may be used, such as a metal core circuit board. Or, instead of a circuit board 16, other types of electrical connections (e.g., wires) can be used to electrically connect the LEDs 14 to a power source. The circuit board 16 can electrically connect the LEDs 14 in a circuit, and other components such as the TEGs 18 and bi-pin end caps 22 can also be electrically connected to the circuit board 16.

The bi-pin end caps 22 can each be of the type including a plastic cap carrying two pins. One of the end caps 22 can be attached at each longitudinal end of the housing 12 for physically and electrically connecting the light tube 10 to a fluorescent fixture. The end caps 22 can be electrically connected to the circuit board 16 to provide power to the circuit board 16 and in turn to the LEDs 14. Each end cap 22 can include two pins, though two of the total four pins can be "dummy pins" that do not provide an electrical connection. Alternatively, other types of electrical connectors can be used, such as an end cap carrying a single pin. Also, while the end caps 22 are shown as including cup-shaped bodies, the end caps 22 can have a different configuration (e.g., the end caps 22 can be shaped to be press fit into the housing 12). An electric circuit can be included within the housing 12 and in an electric path between at least one of the end caps 22 and the circuit board 16 for modifying the electric power received from the fluorescent fixture.

The TEGs can be configured to produce electrical energy using heat produced by the LEDs. For example, the TEGs 18 can be thermoelectric generators of the type including a plurality of thermocouples utilizing the Seeback effect to convert temperature differences within the TEGs 18 produced by the heat to electric voltage. The TEGs 18 can be electrically connected in a series and can be electrically connected to the circuit board 16. For example, wires can extend from the TEGs 18 and can be soldered or otherwise electrically connected to each other to electrically connect the TEGs 18 in a series, and wires can also electrically connect the TEGs 18 to the circuit board 16 or another type of LED power source. The TEGs 18 can be electrically connected to the circuit board 16 in series with an electrical connection between one or more of the end caps 22 and the circuit board 16. As a result, electrical energy produced by the TEGs 18 can be communicated to the LEDs 14 via the circuit board 16 for use in producing light. The TEGs 18 can alternatively be electrically connected to the LEDs 14 in series with an electrical connection between one or more of the end caps 22 and the LEDs 14.

The TEGs 18 are operable to produce electrical energy in response to a heat differential across their thickness. When arranged as shown in FIG. 1, a first side 18a of each TEG 18 is thermally coupled to the circuit board 16 and thus to the associated LED 14, while a second, opposing side 18b of each TEG 18 is open to the atmosphere which acts as a heat sink or dissipater. "Thermally coupled" as used herein refers to being able to absorb heat from. "Open to the atmosphere" as used herein refers to having at least one side through which heat can dissipate directly to the surrounding ambient fluid, typically air, inside the housing 12. This arrangement allows heat produced by the LEDs 14 during operation and conducted to the TEGs 18, as well as the heat lost from the TEGs 18 to the atmosphere, to create a temperature differential across the thickness of the TEGs 18. That is, the side 18a of the TEGs 18 thermally coupled to the circuit board 16 can have a higher temperature than the opposing side 18b of the TEGs 18 open to the atmosphere. The TEGs 18 can produce electrical energy, such as electrical voltage, from this heat differential. Since the TEGs 18 are electrically connected to the LEDs 14, the electrical energy produced by the TEGs 18 can be used to at least partially power the LEDs 14. The TEGs 18 can provide electrical energy to supplement the power received by the light tube 10 from a fluorescent fixture via the end caps 22, or from an alternative power source, such as a battery. The TEGs 18 can thus increase the efficiency of the light tube 10.

Figure 2:
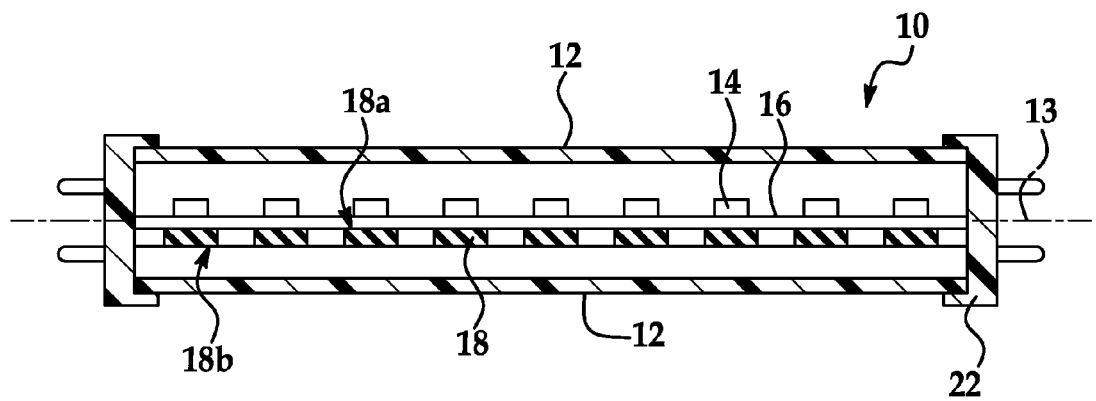
FIG. 2 is a cross section of another aspect of the LED-based light tube of FIG. 1.

The LED-based light tube 10 shown in FIG. 1 can further comprise a heat sink 20 positioned in the LED-based light tube 10' of FIG. 2. While the housing 12 is shown as extending circumferentially around the heat sink 20, the housing 12 can alternatively allow at least a portion of the heat sink 20 to be exposed to an ambient environment about the light tube 10'. For example, the housing 12 can have a semi-cylindrical cross-section having longitudinal edges engaged with the heat sink 20. The TEGs 18 can be physically attached to the circuit board 16 and/or the heat sink 20 using, as an example, thermally conductive tape. If the circuit board 16, TEGs 18 and heat sink 20 are attached in another manner (e.g., such by being physically pressed or clamped together by bolts, a tight-tolerance fit, or clamps) thermal paste can be included at junctions between the TEGs 18 and the circuit board 16 and heat sink 20, respectively.

The TEGs 18 can be disposed along heat transfer paths originating at the respective LEDs 14 and extending to the ambient environment. For example, the circuit board 16 can draw heat away from the LEDs 14 and transfer that heat to the heat sink 20, in which case multiple heat transfer paths extend from respective LEDs 14 toward the heat sink 20. Each discrete TEG 18 can be thermally coupled to a side of the circuit board 16 opposite the LEDs 14 at a position along one the heat transfer paths as shown in FIG. 2. For example, if the LEDs 14 are longitudinally spaced along a length of the circuit board 16, the TEGs 18 can be spaced at equal intervals as the LEDs 14 and in alignment with the LEDs 14. Alternatively, a single TEG 18 that extends the length of the circuit board 16 and is overlaid by all the LEDs 14 can be used, or multiple TEGs 18 that are each overlaid by multiple LEDs 14 can be used. The TEGs 18 can have a thickness on the range of a few millimeters or smaller (e.g., less than 3 millimeters). The relative thinness of the TEGs 18 can aid heat transfer from the TEGs 18 to the heat sink 20.

As noted, the TEGs 18 are operable to produce electrical energy in response to a heat differential across their thickness. When arranged as shown in FIG. 2, a first side 18a of each TEG 18 is thermally coupled to the circuit board 16 and thus to the associated LED 14, while a second, opposing side 18b of each TEG 18 is thermally coupled to the heat sink 20. This arrangement allows heat produced by the LEDs 14 during operation and conducted to the TEGs 18, as well as the heat extracted from the TEGs 18 by the heat sink 20, to create a temperature differential across the thickness of the TEGs 18. That is, the side 18a of the TEGs 18 thermally coupled to the circuit board 16 can have a higher temperature than the opposing side 18b of the TEGs 18 thermally coupled to the heat sink 20. The TEGs 18 can produce electrical energy, such as electrical voltage, from this heat differential. Since the TEGs 18 are electrically connected to the LEDs 14, the electrical energy produced by the TEGs 18 can be used to at least partially power the LEDs 14. For example, the TEGs 18 can provide electrical energy to supplement the power received by the light tube 10' from a fluorescent fixture via the end caps 22, or from an alternative power source, such as a battery. The TEGs 18 can thus increase the efficiency of the light tube 10'.

The heat sink 20 can be constructed from a highly thermally conductive material, such as aluminum, another highly thermally conductive metal, or a highly thermally conductive polymer of the type available from Cool Polymers, Inc. of Warwick, R.I. The shape of the heat sink 20 can provide a large surface area, such as by the inclusion of fins, pins, or other surface area increasing structures for increasing the ability of the heat sink 20 to dissipate heat. The heat sink 20 can be thermally coupled to the TEGs 18 and can dissipate heat originating at the LEDs 14 and reaching the heat sink 20 via heat paths passing through the TEGs 18. The heat sink 20 can conduct heat from the side 18b of the TEGs 18 opposite the circuit board 16, thereby aiding in the temperature difference across the thickness of the TEGs 18 and providing regulation of the temperature of the LEDs 14. Also, while not shown in FIG. 2, the heat sink 20 can include raised portions in contact with the circuit board 16 between the spaced TEGs 18 and at other locations between the circuit board 16 and heat sink 20 not occupied by the TEGs 18 to increase heat transfer between the circuit board 16 and the heat sink 20.

Figure 3:
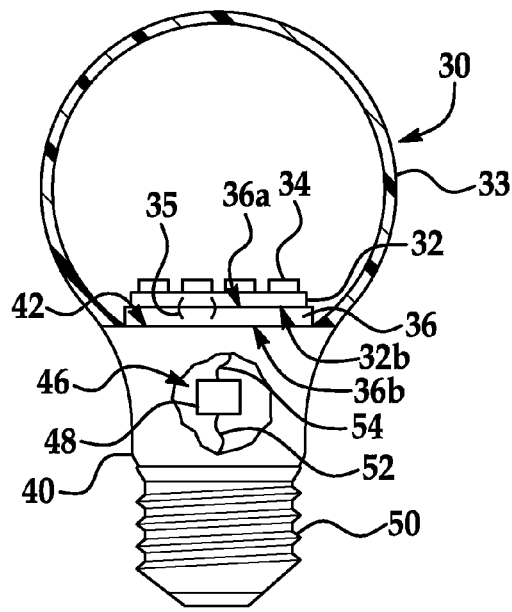
FIG. 3 is a side view of an example of an LED-based light bulb having an Edison-type screw thread, including a cutaway showing a cavity defined by a base of the light bulb.

While the light tubes 10, 10' shown in FIGS. 1 and 2 are examples of an LED-based light to replace a fluorescent tube in a fluorescent fixture, other types of LED-based lights can also include TEGs. For example, FIG. 3 shows an example of an LED-based light bulb 30 to replace incandescent lights. The LED-based light bulb 30 has a circuit board 32 having multiple LEDs 34 mounted thereon in electrical connection with the circuit board 32. A lens or cover 33 formed of polycarbonate or another light transmitting material can enclose the circuit board 32, and the cover 33 can include light modifying structures (e.g., diffusing film, surface roughening, etc.). A TEG 36 is thermally coupled to the circuit board 32. As shown, a first side 36a of the TEG 36 is in contact with a side 32b of the circuit board 32 opposite the LEDs 34. The TEG 36 can be electrically connected to the circuit board 32. For example, a pair of wires 35 can electrically connect the TEG 36 to the circuit board 32, though alternative structures for electrically connecting the circuit board 32 and TEG 36 can be used.

A highly thermally conductive base 40 can act as a heat sink for dissipating heat produced by the LEDs 34. The base 40 can include a platform 42 on which the TEG 36 can be supported and thermally coupled thereto. For example, a second side 36b of the TEG 36 opposite the first side 36a can contact the platform 42. Thermal paste can be included at the junctions on either side of the TEG 36 to improve heat flow. The base 40 can define a cavity 46 for storing electronics 48, such as power conversion electronics (e.g., a rectifier, a filtering capacitor, and/or DC to DC conversion circuitry). The electronics 48 can be electrically coupled to an Edison-type screw thread 50 that is compatible with standard Edison-type fixtures. For example, wires 52 can electrically couple the electronics 48 to the screw thread 50. The electronics 48 can modify current received from a socket via the screw thread 50. The electronics 48 can be electrically coupled to the circuit board 32 via wires 54, and the wires 54 can pass through an aperture (not shown) defined by the platform 42 of the base 40.

In operation, the LEDs 34 can receive power from a standard Edison-type fixture via the screw thread 50, electronics 48 and circuit board 32. As the LEDs 34 operate, they produce heat. The TEG 36 is in a path along which heat travels from the circuit board 32 to the base 40, and the base 40 can dissipate heat received from the circuit board 32 and the TEG 36 to the ambient environment. A temperature differential can form across the TEG 36, with the side 36a being hotter than the side 36b. The TEG 36 can produce electrical energy from this heat differential, and the TEG 36 can communicate this electrical energy back to the circuit board 32 via the wires 35. The circuit board 32 in turn can power the LEDs 34 using both electrical energy received from the TEG 36 and power received from the thread 50. In an alternative example, the TEG 36 can be electrically connected to the electronics 48 instead of the circuit board 32, and electrical energy produced by the TEG 36 can be routed to the circuit board 32 via the electronics 48.

Figure 4:
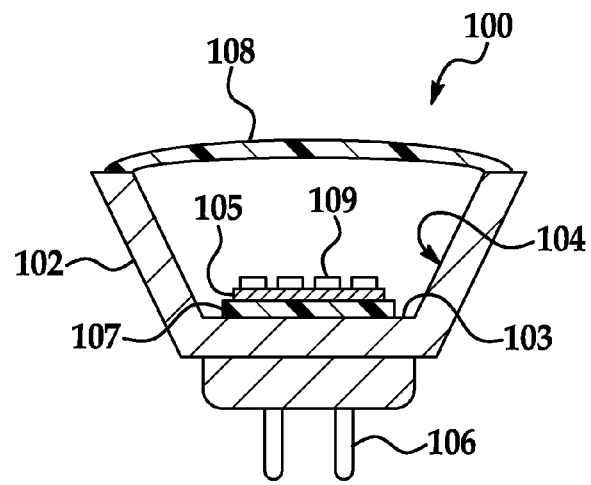
FIG. 4 is a cross section of an example of an LED-based light bulb including a reflector and pin-type connectors.

Yet another example of a type of LED-based light including TEGs is shown in FIG. 4. An LED-based flood light bulb 100 includes a base 102 defining a reflector surface 104, such as a mirrored finish or other highly reflective surface, surrounding and angled relative to a platform 103. A circuit board 105 and a TEG 107 can be mounted on the platform 103 using, for example, thermoelectric tape. A plurality of LEDs 109 can be mounted on and electrically coupled to the circuit board 105. The circuit board 105 can additionally be electrically coupled to the TEG 107 and an electrical connector 106 of the bulb 100, which is shown as a pair of pins but can have an alternative configuration. The circuit board 105 can be electrically coupled to the electrical connector 106 via, as an example, power conversion electronics (not shown) for converting power from a type received from a fixture to a type suitable for the LEDs 109. A light transmitting cover or lens 108 can span the reflective surface 104 to enclose the circuit board 105, TEG 107 and LEDs 109.

In operation, the LEDs 109 can receive power from a fixture in which the bulb 100 is installed via the connector 106 and circuit board 105. The LEDs 109 can produce light that travels directly out the cover 108 or indirectly out the cover 108 after being reflected by the reflector 104. During operation, the LEDs 109 produce heat, and the heat can pass through the circuit board 105 to the TEG 107. Some of the heat can continue to the base 102, which can dissipate heat to an ambient environment about the bulb 100. The TEG 107 can produce electrical energy from the heat differential produced across it between the circuit board 105 and base 102. The TEG 107 can communicate the electrical energy to the circuit board 105, which can supply the electrical energy to the LEDs 109, thereby increasing the efficiency of the bulb 100 compared to a conventional bulb.

Figure 5:
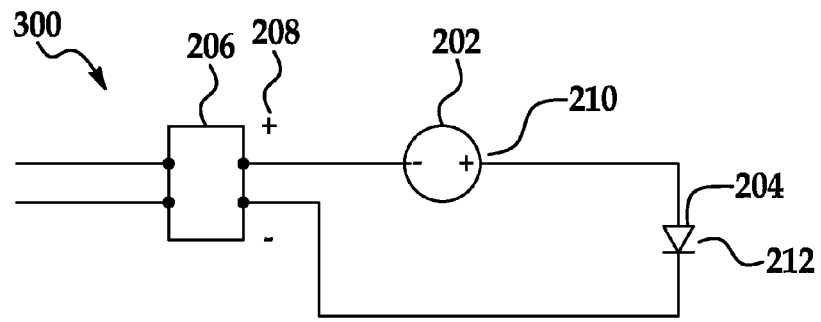
FIG. 5 is a schematic diagram of one exemplary power converter circuit usable in any of the LED-based lights of FIGS. 1-4.

An example of a power converter circuit 200 is shown in FIG. 5 that can be utilized as power conversion electronics or as a component of the power conversion electronics. By utilizing the circuit 200, the overall power consumption of an LED-based light can be reduced because the electrical energy produced by the TEG 202 can be used to supplement the power supplied to the LED 204 from an external power source. Although LED 204 is shown as a single LED, LED 204 could alternatively be a plurality of LEDs electrically connected to each other.

The circuit 200 includes a power converter 206 electrically connected to a power source and configured to produce a voltage 208, which can be applied to power the LED 204. In addition, the circuit 200 includes a TEG 202 configured to produce electrical energy in the form of a voltage 210 in response to heat produced by the LED 204. If the TEG 202 is selected to provide approximately the same amount of current as the current rating of the LED 204, the TEG 202 and the power converter 206 can be combined in series to provide a voltage 212 sufficient to power the LED 204. In this configuration, the voltage 212 required by the LED 204 can be supplied by both the power converter 206 and the TEG 202. Because the voltage 212 required by the LED 204 is a relatively fixed value, the voltage 210 produced by the TEG 202 serves to reduce the voltage 208 that must be provided by the power converter 206 in order to power the LED 204. Thus, voltage 208 that must be provided by the power converter 206 is equal to the voltage 212 required by the LED 204 minus the voltage 210 produced by the TEG 202. Further reduction in the voltage 208 that must be produced by power converter 206 could be realized by modifying the circuit 200 to include a plurality of TEGs 202 in a series aiding arrangement. In this arrangement, the voltage 208 that must be provided by the power converter 206 is equal to the voltage 212 required by the LED 204 minus the sum of the voltages 210 produced by the plurality of TEGs 202.

The circuit 200 has the advantage of simplicity compared to other possible circuit topologies. In addition, the TEG 202 is maintained at approximately the same potential as the LED 204, which may be advantageous for safety reasons, if for example, the power converter 206 is of the low voltage isolated output type and the LED 204 is accessible to a user.

Figures 6, 7:
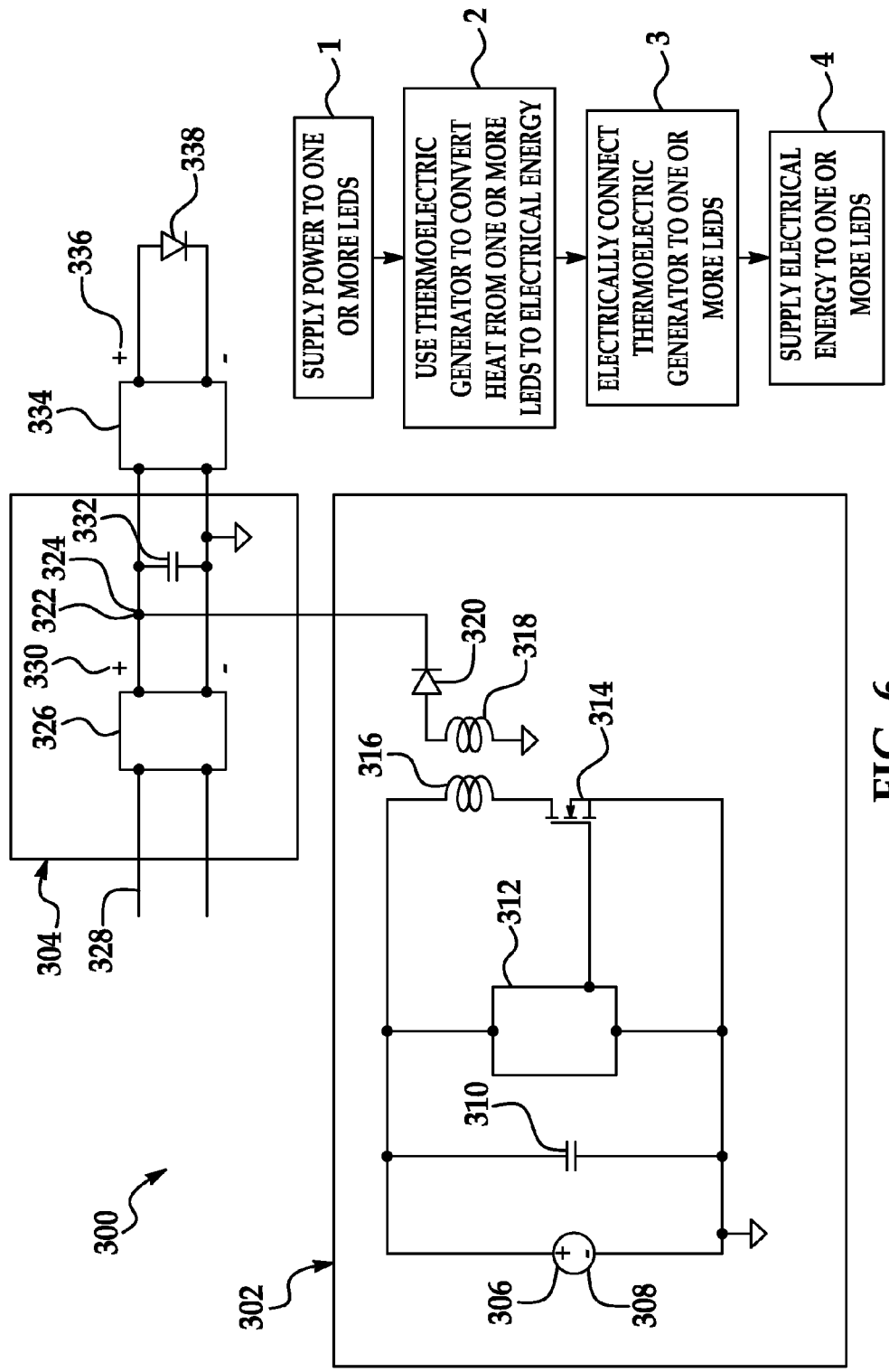
FIG. 6 is a schematic diagram of another exemplary power converter circuit usable in any of the LED-based lights of FIGS. 1-4.
FIG. 7 is a flow diagram of a method of supplying power to at least one LED in any of the LED-based lights of FIGS. 1-4.

Another example of a power converter circuit 300 that can be utilized as power conversion electronics or as a component of power conversion electronics is shown in FIG. 6. The circuit 300 includes a TEG conversion circuit 302 and an LED power input circuit 304. The TEG conversion circuit 302 conditions the electrical energy produced by the TEG 306, here illustrated as a voltage 308, to a form appropriate for use in the LED power input circuit 304. The TEG conversion circuit 302 uses a flyback mode switching power supply circuit to condition a relatively low voltage 308 produced by the TEG 306 to a higher voltage. In the illustrated TEG conversion circuit 302, a capacitor 310, such as a filtering capacitor, is connected across the output of the TEG 306. A controller 312 is further connected across the output of the TEG 306 and capacitor 310, and controls the operation of a switch 314, which is illustrated as a FET switch. The switch 314 is connected to split inductors 316 and 318. The inductor 318 is connected to diode 320, which is connected to LED power input circuit 304 to provide a conditioned voltage 322 to an internal node 324. Although a flyback mode switching power supply circuit is illustrated, it is to be understood that other known circuit topologies are available and may be utilized to condition the electrical energy produced by the TEG 306 to a form appropriate for utilization in the LED power input circuit 304.

In operation, the TEG conversion circuit 302 operates to supply the conditioned voltage 322 to an internal node 324 of the LED power input circuit 304. The LED power input circuit 304 includes a rectifier 326 configured to convert an AC line voltage 328 to a rectified input voltage 330. The conditioned voltage 322 is supplied to the internal node 324 connected to the rectified input voltage 330. A capacitor 332, such as a filtering capacitor, is connected across the rectified input voltage 330 and the conditioned voltage 322. An LED power converter 334 is connected across the capacitor 332, and is configured to produce a voltage 336, which can be applied to power an LED 338. The LED power converter 334 can be any known converter commonly used in LED circuits, including those using buck, buck-boost or flyback. Although LED 338 is shown as a single LED, LED 338 could alternatively be a plurality of LEDs electrically connected to each other. In the illustrated circuit 300, the overall power consumption of an LED-based light can be reduced by utilizing the electrical energy produced by the TEG 306 to supplement the electrical energy, here an AC line voltage 328, that must be supplied to the LED input circuit 304 in order to power the LED 338.

Power converter circuit 200 and power converter circuit 300 can each be utilized in any LED-based light disclosed herein, including the LED-based light tubes 10, 10' shown in FIGS. 1 and 2, the LED-based bulb 30 shown in FIG. 2 and the LED-based flood light bulb 100 shown in FIG. 3.

Methods of providing power to an LED in an LED based light are also disclosed herein. The methods can be used with any of the LED based lights disclosed herein. One method shown in FIG. 7 comprises supplying power provided by a power source to the one or more LEDs in step 1. Heat generated as a byproduct by the one or more LEDs is converted to electrical energy by at least one thermoelectric generator in step 2. The thermoelectric generator is in thermally conductive relation with the one or more LEDs. The thermoelectric generator is also electrically connected to the one or more LEDs, as shown in step 3. In step 4, the electrical energy is supplied to the one or more LEDs from the electrically connected thermoelectric generator to supplement the power supplied by the power source to the one or more LEDs.

The heat is recycled back to the LEDs in the form of energy. This electrical energy can be, for example, in the form of voltage. The method can include providing a power conversion circuit configured to condition the voltage prior to supplying the voltage to the one or more LEDs. Conditioning can be, as a non-limiting example, converting the voltage from a lower voltage to a higher voltage.

The above-described examples have been described in order to allow easy understanding of the invention and do not limit the invention. On the contrary, the invention is intended to cover various modifications and equivalent arrangements, whose scope is to be accorded the broadest interpretation so as to encompass all such modifications and equivalent structure as is permitted under the law.

We claim:

1. An LED based light comprising:
   at least one LED; and
   at least one thermoelectric generator having a first side and a second side, wherein the first side is thermally coupled to the at least one LED such that heat generated by the at least one LED is conducted to the at least one thermoelectric generator, producing a temperature differential between the first side and second side, wherein the at least one thermoelectric generator is configured to produce electrical energy from the temperature differential;
   wherein the at least one thermoelectric generator has an electrical connection to the at least one LED, wherein the electrical energy produced by the at least one thermoelectric generator is provided to the at least one LED.

2. The LED based light of claim 1, wherein the electrical energy produced by the at least one thermoelectric generator is voltage.

3. The LED based light of claim 1, wherein the at least one thermoelectric generator is electrically connected in series with the at least one LED.

4. An LED based light comprising:
   at least one LED; and
   at least one thermoelectric generator having a first side and a second side, wherein the first side is thermally coupled to the at least one LED such that heat generated by the at least one LED is conducted to the at least one thermoelectric generator, producing a temperature differential between the first side and second side, wherein the at least one thermoelectric generator is configured to produce electrical energy from the temperature differential;
   wherein the at least one LED is a plurality of LEDs and the at least one thermoelectric generator is a plurality of thermoelectric generators, each of the plurality of LEDs being thermally coupled to a respective one of the plurality of thermoelectric generators.

5. An LED based light comprising:
   at least one LED; and
   at least one thermoelectric generator having a first side and a second side, wherein the first side is thermally coupled to the at least one LED such that heat generated by the at least one LED is conducted to the at least one thermoelectric generator, producing a temperature differential between the first side and second side, wherein the at least one thermoelectric generator is configured to produce electrical energy from the temperature differential;
   wherein the at least one thermoelectric generator is a plurality of thermoelectric generators electrically connected to each other in series.

6. An LED based light comprising:
   at least one LED;
   at least one thermoelectric generator having a first side and a second side, wherein the first side is thermally coupled to the at least one LED such that heat generated by the at least one LED is conducted to the at least one thermoelectric generator, producing a temperature differential between the first side and second side, wherein the at least one thermoelectric generator is configured to produce electrical energy from the temperature differential; and
   a heat sink adjacent to the second side of the at least one thermoelectric generator and configured to increase the temperature differential between the first side and the second side;
   wherein the heat sink is disposed in thermally conductive relation to the second side of the at least one thermoelectric generator; and
   wherein the at least one thermoelectric generator is disposed in thermally conductive relation to the at least one LED, and the at least one thermoelectric generator is disposed between the at least one LED and the heat sink.

7. An LED based light for use in a conventional lighting fixture comprising:
   a circuit board;
   at least one LED mounted on the circuit board and configured to receive electrical energy from a power source;
   at least one thermoelectric generator configured to generate an electrical energy in response to heat received from the at least one LED; and
   a power converter circuit connected to the power source and configured to electrically connect the least one thermoelectric generator to the least one LED and to power the at least one LED with the electrical energy provided by the at least one thermoelectric generator.

8. The LED based light of claim 7, wherein the at least one thermoelectric generator includes a first side and a second side and is configured to produce an electrical energy from a temperature differential between the first side and the second side, wherein the electrical energy produced is a voltage.

9. The LED based light of claim 7, wherein the at least one LED is a plurality of LEDs and the at least one thermoelectric generator is a plurality of thermoelectric generators, each of the plurality of thermoelectric generators in thermally conductive relation with a respective LED.

10. The LED based light of claim 8 further comprising:
    a heat sink in thermally conductive relation with one of the first side and the second side of the at least one thermoelectric generator, wherein the at least one LED is in thermally conductive relation with an other of the first side and the second side, the heat sink configured to increase the temperature differential between the first side and the second side.

11. The LED based light of claim 7 further comprising:
    a housing including a light transmitting portion, the circuit board being disposed within the housing.

12. The LED based light of claim 11, wherein the housing extends along a longitudinal axis of the light and includes a first end opposing a second end, the first and second ends each including a bi-pin end cap configured for at least physical engagement with a conventional fluorescent light fixture.

13. The LED based light of claim 12, wherein the housing has one of a cylindrical cross section or a semi-cylindrical cross section.

14. The LED based light of claim 10 further comprising:
    a base defining a mounting platform for mounting the circuit board;
    a light transmitting cover adjacent to the base and enclosing the at least one LED; and
    a connector configured for at least physical engagement with a conventional incandescent light fixture.

15. The LED based light of claim 14 wherein the base includes the heat sink.

16. The LED based light of claim 7, wherein the power converter circuit comprises a thermoelectric generator conversion circuit and an LED power input circuit, wherein the electrical energy from the at least one thermoelectric generator is converted in the thermoelectric generator conversion circuit and provided to the LED power input circuit to power the at least one LED.

17. A method of providing power to an LED in an LED based light comprising:
   supplying power provided by a power source to at least one LED;
   converting heat generated by the at least one LED to electrical energy with at least one thermoelectric generator in thermally conductive relation with the at least one LED;
   electrically connecting the at least one thermoelectric generator to the least one LED; and
   supplying the electrical energy to the at least one LED from the electrically connected at least one thermoelectric generator to supplement the power supplied by the power source.

18. The method of claim 17, wherein the electrical energy is a voltage and the at least one thermoelectric generator is a plurality of thermoelectric generators, the method further comprising:
   electrically connecting the plurality of thermoelectric generators in series.

19. The method of claim 17, wherein the electrical energy is voltage, the method further comprising:
   providing a power conversion circuit configured to condition the voltage prior to supplying the voltage to the at least one LED.

* * * * *